United States Patent
Kinouchi et al.

(10) Patent No.: US 9,443,711 B2
(45) Date of Patent: Sep. 13, 2016

(54) ROOM-TEMPERATURE BONDING APPARATUS

(75) Inventors: Masato Kinouchi, Tokyo (JP); Takayuki Goto, Tokyo (JP); Takeshi Tsuno, Tokyo (JP); Kensuke Ide, Tokyo (JP); Takenori Suzuki, Tokyo (JP)

(73) Assignee: Mitsubishi Heavy Industries Machine Tool Co., Ltd., Tokyo (JP)

( * ) Notice: Subject to any disclaimer, the term of this patent is extended or adjusted under 35 U.S.C. 154(b) by 246 days.

(21) Appl. No.: 14/345,984

(22) PCT Filed: Feb. 24, 2012

(86) PCT No.: PCT/JP2012/054593
§ 371 (c)(1),
(2), (4) Date: Mar. 20, 2014

(87) PCT Pub. No.: WO2013/061628
PCT Pub. Date: May 2, 2013

(65) Prior Publication Data
US 2014/0224405 A1  Aug. 14, 2014

(30) Foreign Application Priority Data
Oct. 27, 2011 (JP) ................. 2011-236545

(51) Int. Cl.
*H01L 21/02* (2006.01)
*H01L 21/67* (2006.01)
*H01L 21/683* (2006.01)

(52) U.S. Cl.
CPC ......... *H01L 21/02* (2013.01); *H01L 21/67011* (2013.01); *H01L 21/67092* (2013.01); *H01L 21/67253* (2013.01); *H01L 21/6831* (2013.01)

(58) Field of Classification Search
CPC ............. H01L 21/02; H01L 27/67011; H01L 21/67092; H01L 21/67523; H01L 21/6831; B81C 3/001; B81C 99/025; B81C 2201/0143; B81C 2201/0181
USPC ........ 156/64, 379, 8, 272.2, 273.7, 367, 368
See application file for complete search history.

(56) References Cited

FOREIGN PATENT DOCUMENTS

| JP | 10-97202 A | 4/1998 |
|---|---|---|
| JP | 2791429 B2 | 8/1998 |
| JP | 3970304 B1 | 9/2007 |
| JP | 2007-281203 A | 10/2007 |
| JP | 4172806 B2 | 10/2008 |
| JP | 2008-283086 A | 11/2008 |
| JP | 2009-10263 A | 1/2009 |
| JP | 2009-49081 A | 3/2009 |
| JP | 2009-147257 A | 7/2009 |

OTHER PUBLICATIONS

Extended European Search Report dated May 15, 2015 issued in corresponding EP Application No. 12 84 4336.3.

*Primary Examiner* — George Koch
(74) *Attorney, Agent, or Firm* — Birch, Stewart, Kolasch & Birch, LLP

(57) ABSTRACT

A room-temperature bonding apparatus of the present invention includes: a plurality of first beam sources configured to emit a plurality of first activation beams which are irradiated to a first activation surface of a first substrate; a plurality of second beam sources configured to emit a plurality of second activation beams which are irradiated to a second activation surface of a second substrate; and a pressure welding mechanism configured to bond the first substrate and the second substrate by bring the first activation surface and the second activation surface contact, after the first activation surface and the second activation surface are irradiated. The room-temperature bonding apparatus can more uniformly irradiate to the first activation surface and the second activation surface, so that the first substrate and the second substrate can be more appropriately bonded with each other, compared with another room-temperature bonding apparatus which irradiates the first activation surface and the second activation surface by using one beam source.

6 Claims, 9 Drawing Sheets

ROOM-TEMPERATURE BONDING APPARATUS

This application is a national stage entry of PCT/JP2012/054593 filed Feb, 24, 2012.

TECHNICAL FIELD

The present invention relates to a room-temperature bonding apparatus, and particularly, relates to a room-temperature bonding apparatus for bonding a plurality of substrates by bringing surfaces activated in a vacuum ambience into contact with each other.

BACKGROUND ART

MEMS (Micro Electro Mechanical Systems) is known in which minute electric parts and machine parts are integrated. The MEMS is exemplified by a micro-machine, a pressure sensor, an ultra-compact motor, and so on. A semiconductor device is known which is manufactured by laminating LSIs (Large Scale Integration) formed on a semiconductor wafer. Such a semiconductor device can reduce increase of leakage current, and a signal delay due to an interconnection, for example.

Room-temperature bonding is known in which wafer surfaces are activated in a vacuum ambience and brought into contact with each other, so as to perform bonding of the wafers. Such room-temperature bonding is preferable for making the MEMS and is preferable for making the semiconductor device. The MEMS and the semiconductor device are requested be manufactured in an increased productivity and price reduction and be manufactured from large-diameter semiconductor wafers. For this reason, a room-temperature bonding apparatus is desired which can more appropriately perform room-temperature bonding of large-diameter semiconductor wafers.

A room-temperature bonding apparatus which can perform room-temperature bonding of larger substrates, tends to be larger in size. The room-temperature bonding apparatus is desired which can perform room-temperature bonding of large substrates and which is more compact.

Japanese Patent No. 2791429 discloses a silicon wafer bonding method in which a resultant substrate has great bonding strength and which does not require pressing with a load and heating treatment. The silicon wafer bonding method is a method of bonding a silicon wafer and a silicon wafer, and is characterized in that bonding surfaces of the silicon wafers are irradiated with an inert gas ion beam or an inert gas fast atom beam in a room-temperature vacuum ambience prior to the bonding for sputter etching.

Japanese Patent Publication (JP 2009-49081A) discloses a room-temperature bonding apparatus which can prevent electrode surface oxidation for stabilization. The bonding apparatus bonds a plurality of electrode surfaces formed on two wafers. The bonding apparatus has a planarization unit for planarizing the electrode surfaces, an activation unit for activating the planarized electrode surfaces, an alignment unit for performing alignment of the electrode surfaces, an overlap unit for making the aligned electrode surfaces overlap each other, a pressurization unit for pressurizing the overlapped two wafers, and a conveyer unit for conveying the wafer to at least one of the planarization unit, the activation unit, the alignment unit, the overlap unit, and the pressurization unit.

Japanese Patent No. 3970304 discloses a room-temperature bonding apparatus for performing room-temperature bonding. The room-temperature bonding apparatus has a bonding chamber which generates a vacuum ambience for performing room-temperature bonding of an upper substrate and a lower substrate, an upper stage which is located inside the bonding chamber and supports the upper substrate in the vacuum ambience, a carriage which is located inside the bonding chamber and supports the lower substrate in the vacuum ambience, an elastic guide unitarily coupled to the carriage, a positioning stage which is located inside the bonding chamber and supports the elastic guide to be movable in a horizontal direction, a first mechanism which drives the elastic guide and moves the carriage in the horizontal direction, a second mechanism which moves the upper stage in an up-and-down direction perpendicular to the horizontal direction, and a carriage support which is located inside the bonding chamber and supports the carriage in a direction of the movement of the upper stage when the lower substrate and the upper substrate are subjected to pressure welding. The elastic guide supports the carriage so that the carriage does not come into contact with the carriage support when the lower substrate and the upper substrate do not come into contact with each other, and is elastically deformed so that the carriage comes into contact with the carriage support when the lower substrate and the upper substrate are pressed against each other.

Japanese Patent No. 4172806 discloses a room-temperature bonding method in which intermediate material is uniformly formed on a substrate surface, to obtain sufficient bonding strength even when pressure bonding is performed at room temperature without the necessity of heating at the time of bonding. The room-temperature bonding method, which is a method of bonding a plurality of substrates at room temperature through intermediate material, is characterized in that the room-temperature bonding method includes a step of forming the intermediate material on bonding surfaces of the substrates by performing physical sputtering for a plurality of targets, and a step of activating the bonding surfaces of the substrates through physical sputtering.

CITATION LIST

Patent Literature 1: Japanese Patent No. 2791429
Patent Literature 2: JP 2009-49081A
Patent Literature 3: Japanese Patent No. 3970304
Patent Literature 4: Japanese Patent No. 4172806

SUMMARY OF THE INVENTION

An object of the present invention is to provide a room-temperature bonding apparatus which can bond a plurality of substrates more appropriately.

Another problem of the present invention is to provide more compact room-temperature bonding apparatus.

Still another object of the present invention is to provide a room-temperature bonding method to make the room-temperature bonding apparatus for bonding a plurality of substrates more compact.

A room-temperature bonding apparatus of the present invention includes: a plurality of first beam sources configured to emit a plurality of first activation beams which are irradiated to a first activation surface of a first substrate; a plurality of second beam sources configured to emit a plurality of second activation beams which are irradiated to a second activation surface of a second substrate; and a pressure welding mechanism configured to bond the first substrate and the second substrate by bring the first activation surface and the second activation surface contact, after the first activation surface and the second activation surface are irradiated. The room-temperature bonding apparatus can more uniformly irradiate to the first activation surface and the second activation surface, so that the first substrate and the second substrate can be more appropriately bonded with each other, compared with another room-temperature bonding apparatus which irradiates the first activation surface and the second activation surface by using one beam source.

The room-temperature bonding apparatus according to the present invention further includes a plurality of installation position adjusting mechanisms corresponding to the plurality of first beam sources and the plurality of second beam sources. One installation position adjusting mechanism corresponding to an optional beam source of the plurality of installation position adjusting mechanisms fixes the optional beam source on an optional installation position of a plurality of installation positions. A first activation surface and a second activation surface are not sometimes irradiated more uniformly, compared with a case where the plurality of first beam sources and the plurality of second beam sources are not appropriately manufactured. At this time, such a room-temperature bonding apparatus can more uniformly irradiate the first activation surface and the second activation surface and bond the first substrate and the second substrate more appropriately, by changing the positions of some beam sources of the plurality of first beam sources and the plurality of second beam sources.

The room-temperature bonding apparatus according to the present invention further includes a first support unit which supports the first substrate when the first activation surface is irradiated with the plurality of first activation beams, and a second support unit which supports the second substrate when the second activation surface is irradiated with the plurality of second activation beams. The plurality of first beam sources are arranged to be rotationally symmetric with respect to a first rotation axis. The first rotation axis is orthogonal to the first activation surface when the first activation surface is irradiated with the plurality of first activation beams. The plurality of second beam sources are arranged to be rotationally symmetric with respect to a second rotation axis. The second rotation axis is orthogonal to the second activation surface when the second activation surface is irradiated with the plurality of second activation beams. Such a room-temperature bonding apparatus can activate the first activation surface and the second activation surface more uniformly and bond the first substrate and the second substrate more appropriately, compared with another room-temperature bonding apparatus in which the plurality of first beam sources and the plurality of second beam sources are not disposed to be rotationally symmetric.

The room-temperature bonding apparatus according to the present invention further includes a control unit which controls the plurality of first beam sources and the plurality of second beam sources such that one optional activation beam of the plurality of first activation beams and the plurality of second activation beams is different from another activation beam of the plurality of first activation beams and the plurality of second activation beams. Such a room-temperature bonding apparatus can activate the first activation surface and the second activation surface more appropriately, and bond the first substrate and the second substrate more appropriately, compared with another room-temperature bonding apparatus in which the plurality of first beam sources and the plurality of second beam sources are controlled in the same way.

The room-temperature bonding apparatus according to the present invention further includes a vacuum exhaust unit which exhausts the inside of a chamber to generates a vacuum ambience inside the chamber, in which the plurality of first activation beams and the plurality of second activation beams are emitted. The control unit controls the plurality of first beam sources and the plurality of second beam sources such that in a period for which the optional activation beam of the plurality of first activation beams and the plurality of second activation beams is emitted, another activation beam of the plurality of first activation beams and the plurality of second activation beams is not emitted.

In such a room-temperature bonding apparatus, the vacuum ambience can be generated continuously inside the chamber by exhausting at an exhaust speed above a minimum exhaust speed required when only activation beams of a part of the plurality of first activation beams and the plurality of second activation beams are emitted, without exhausting at a maximum exhaust speed required when all of the plurality of first activation beams and the plurality of second activation beams emits at a same time. It is possible to apply to such a room-temperature bonding apparatus, a small vacuum exhaust unit which cannot exhaust at the maximum exhaust speed but can exhaust at the above exhaust speed. By applying such a vacuum exhaust unit smaller in size, the room-temperature bonding apparatus can be manufactured more compactly and cheaplier, compared with another room-temperature bonding apparatus which a large-sized vacuum exhaust unit for which can exhaust at the maximum exhaust speed.

The room-temperature bonding apparatus according to the present invention further includes a plurality of gas kind switching mechanisms corresponding to the plurality of first beam sources and the plurality of second beam sources. One gas kind switching mechanism corresponding to an optional beam source of the plurality of gas kind switching mechanisms supplies an optional gas of plurality of gases to the optional beam source. The optional beam source generates an activation beam from the optional gas.

A beam source installation position adjusting method according to the present invention is performed by a using the room-temperature bonding apparatus which includes a plurality of first beam sources which irradiate a plurality of first activation beams to activate a first activation surface of a first substrate, a plurality of second beam sources which irradiate a plurality of second activation beams to activate a second activation surface of a second substrate, a pressure welding mechanism which bonds the first substrate and the second substrate by making the first activation surface and the second activation surface contact after the first activation surface and the second activation surface are irradiated, a plurality of installation position adjusting mechanisms corresponding to the plurality of first beam sources and the plurality of second beam sources, and one installation adjusting mechanism corresponding to an optional beam source of the plurality of installation position adjusting mechanism which fixes the optional beam source on an optional installation position of the plurality of installation positions.

The beam source installation position adjusting method according to the present invention includes irradiating a plurality of first etching rate measurement activation beams respectively emitted from the plurality of first beam sources to a first surface of a first etching rate measurement substrate, and a plurality of second etching rate measurement activation beams respectively emitted from the plurality of second beam sources to a second surface of a second etching rate measurement substrate; measuring a plurality of first etching rates showing etching rates of a plurality of first regions on the first surface when the plurality of first etching rate measurement activation beams are irradiated to the first surface, and a plurality of second etching rates showing etching rates of a plurality of second regions on the second surface when the plurality of second etching rate measurement activation beams are irradiated to the second surface; and adjusting the plurality of installation adjusting mechanisms such that the plurality of first beam sources are positioned to a plurality of first positions which are calculated based on the plurality of first etching rates, and the plurality of second beam sources are positioned to a plurality of second positions which are calculated based on the plurality of second etching rates. The first activation surface and the second activation surface are not sometimes irradiated more uniformly when the plurality of first beam sources and the plurality of second beam source are not appropriately manufactured. At this time, the room-temperature bonding apparatus can position the plurality of first beam sources and the plurality of second beam sources in appropriate positions, more uniformly irradiate the first activation surface and the second activation surface and bond the first substrate and the second substrate more appropriately, by performing such a beam source installation position adjusting method.

The first surface of the first etching rate measurement substrate is covered with a protection film such that the plurality of first regions are irradiated with the plurality of first etching rate measurement activation beams. One first etching rate corresponding to an optional first region of the plurality of first etching rates is calculated based on an etching depth of the optional first region when the plurality of first etching rate measurement activation beams are irradiated to the first surface. The second surface of the second etching rate measurement substrate is covered with a protection film such that the plurality of second regions are irradiated with the plurality of second etching rate measurement activation beams. One second etching rate corresponding to an optional second region of the plurality of second etching rates is calculated based on an etching depth of the optional second region when the plurality of second etching rate measurement activation beams are irradiated to the second surface.

The room-temperature bonding apparatus according to the present invention can irradiate more uniformly and bond two substrates more appropriately, because the plurality of beam sources are disposed to one substrate surface, compared with another room-temperature bonding apparatus in which one substrate surface is irradiated by using one beam source.

DESCRIPTION OF EMBODIMENTS

Figure 1:
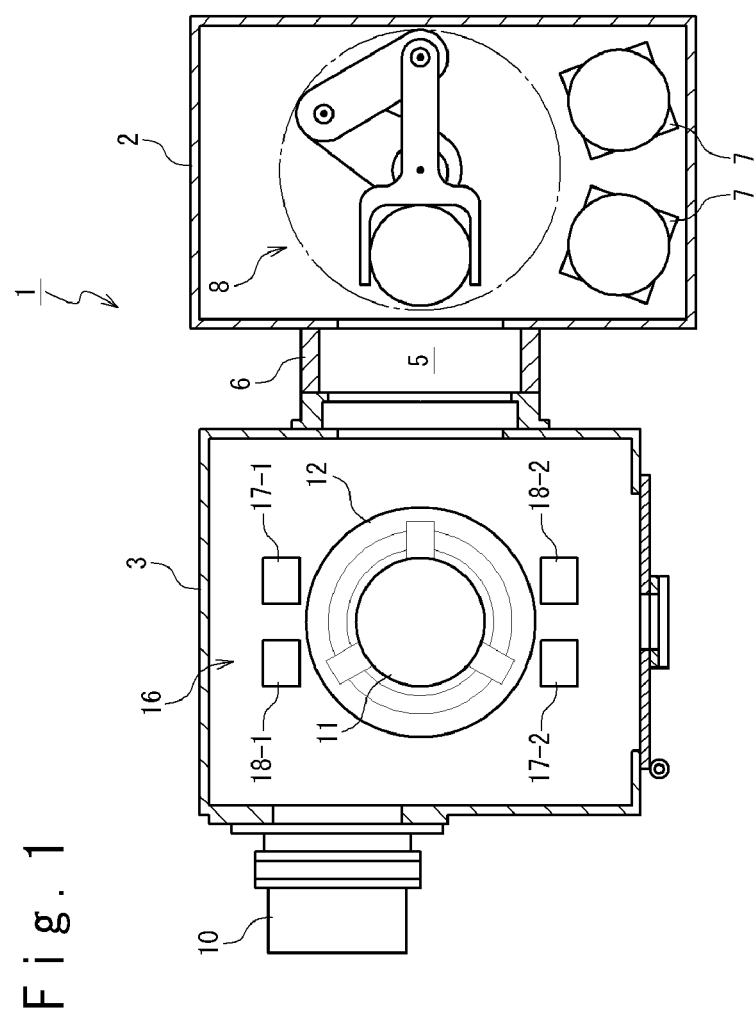
FIG. 1 is a sectional view showing a main body of a room-temperature bonding apparatus.

A room-temperature bonding apparatus according to an embodiment of the present invention will be described with reference to the attached drawings. The room-temperature bonding apparatus has a main body of the room-temperature bonding apparatus and a control unit of the room-temperature bonding apparatus. The main body 1 of the room-temperature bonding apparatus has a load lock chamber 2 and a bonding chamber 3, as shown in FIG. 1. The load lock chamber 2 is formed as a container which seals up its inside from the surroundings. The bonding chamber 3 is formed as a container which seals up its inside from the surroundings. The main body 1 of the room-temperature bonding apparatus further has a gate 5 and a gate valve 6. The gate 5 is disposed between the load lock chamber 2 and the bonding chamber 3, and connects the inside of the bonding chamber 3 and the inside of the load lock chamber 2. The gate valve 6 closes the gate 5 or opens the gate 5 in response to a control of the control unit of the room-temperature bonding apparatus.

The load lock chamber 2 has a lid and a vacuum exhaust unit which are not shown. The lid closes an opening section connecting the surroundings and the inside of the load lock chamber 2, or opens the opening section according to an operation by a user. When the opening section and the gate 5 are closed, the vacuum exhaust unit discharges gas from the inside of the load lock chamber 2 according to a control by the control unit of the room-temperature bonding apparatus. The vacuum exhaust unit is exemplified by a turbo-molecular pump, a cryopump, and an oil-diffusion pump.

The load lock chamber 2 further has a plurality of shelves 7 and a conveyer robot 8 therein. A plurality of cartridges are located on the plurality of shelves 7. The plurality of cartridges are formed generally in the form of a disk. Material of the cartridges is exemplified by aluminum, stainless steel, aluminum nitride, silicon, quartz, and glassy carbon. The cartridges are used with wafers being put on the cartridges. When the gate 5 is opened, the conveyer robot 8 conveys the cartridges put on the plurality of shelves 7 to the inside of the bonding chamber 3, or conveys the cartridges in the bonding chamber 3 to the plurality of shelves 7, according to a control by the control unit of the room-temperature bonding apparatus.

The bonding chamber 3 has a vacuum exhaust unit 10. When the gate 5 is closed, the vacuum exhaust unit 10 discharges gas from the inside of the bonding chamber 3 according to a control by the control unit of the room-temperature bonding apparatus. The vacuum exhaust unit 10 is exemplified by a turbo-molecular pump, a cryopump, and an oil-diffusion pump.

Figure 2:
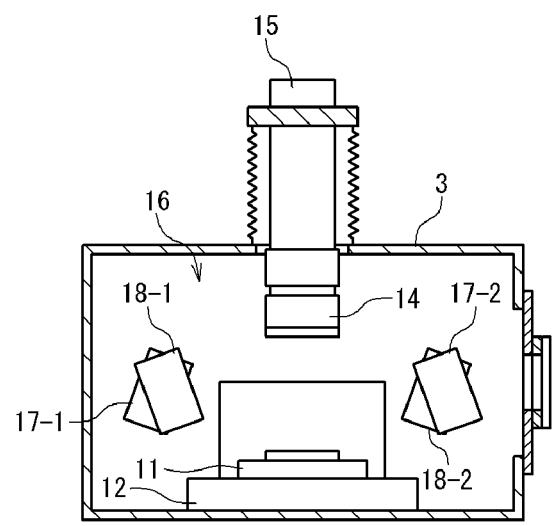
FIG. 2 is a sectional view showing a bonding chamber.

The bonding chamber 3 further has a positioning stage carriage 11 and an alignment mechanism 12, as shown in FIG. 2. The positioning stage carriage 11 is formed in the form of a plate. The positioning stage carriage 11 is positioned inside the bonding chamber 3, and is supported to be movable in a horizontal direction perpendicular to a vertical direction and to be rotationally movable around a rotation axis parallel to a vertical direction. The positioning stage carriage 11 holds a wafer by holding the cartridge on which the wafer is put. The alignment mechanism 12 moves the positioning stage carriage 11 according to a control by the control unit of the room-temperature bonding apparatus, so that the positioning stage carriage 11 moves in a direction parallel to the horizontal direction, or so that the positioning stage carriage 11 rotationally moves around the rotation axis parallel to the vertical direction.

The bonding chamber 3 further has an electrostatic chuck 14 and a pressure welding mechanism 15. The electrostatic chuck 14 is disposed inside the bonding chamber 3 and positioned vertically upwardly from the positioning stage carriage 11. The electrostatic chuck 14 is supported by the bonding chamber 3 to be movable in a direction parallel to the vertical direction. The electrostatic chuck 14 is formed from a dielectric layer of from insulator exemplified by alumina ceramic. The electrostatic chuck 14 has a flat surface positioned almost perpendicular to the vertical direction, at the lower end. The electrostatic chuck 14 further has an internal electrode positioned inside the dielectric layer. A voltage is applied to the internal electrode of the electrostatic chuck 14 according to a control by the control unit of the room-temperature bonding apparatus. Due to the application of the voltage to the internal electrode, the electrostatic chuck 14 holds a wafer or substrate positioned in the vicinity of the flat surface of the dielectric layer, with electrostatic force.

The pressure welding mechanism 15 moves the electrostatic chuck 14 in a direction parallel to the vertical direction with respect to the bonding chamber 3 according to a control by the control unit of the room-temperature bonding apparatus. For example, the pressure welding mechanism 15 positions the electrostatic chuck 14 at one of a plurality of positions according to a control by the control unit of the room-temperature bonding apparatus. The plurality of positions include an alignment position, a home position, and an activation position. The alignment position is designed so that a lower wafer and an upper wafer are located apart from each other by a distance (e.g. 1 mm) when the upper wafer is held by the electrostatic chuck 14 and the lower wafer is held by the positioning stage carriage 11. The home position is vertically upward from the alignment position. The activation position is vertically upward from the home position.

The pressure welding mechanism 15 further measures a position of the electrostatic chuck 14 according to a control by the control unit of the room-temperature bonding apparatus and outputs the position to the control unit of the room-temperature bonding apparatus. The pressure welding mechanism 15 further measures a load applied to the wafer held by the electrostatic chuck 14 according to a control by the control unit of the room-temperature bonding apparatus and outputs the measured load to the control unit of the room-temperature bonding apparatus.

The bonding chamber 3 further has an activation unit 16. The activation unit 16 has a plurality of lower atom beam sources 17-1 and 17-2 and a plurality of upper atom beam sources 18-1 and 18-2. The plurality of lower atom beam sources 17-1 and 17-2 are positioned inside the bonding chamber 3. The plurality of upper atom beam sources 18-1 and 18-2 are positioned inside the bonding chamber 3.

Figure 3:
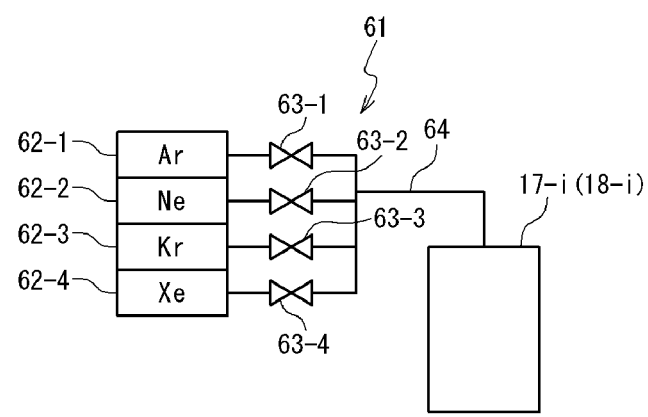
FIG. 3 is a block diagram showing a gas kind switching mechanism.

The main body 1 of the room-temperature bonding apparatus further has a plurality of gas kind switching mechanisms corresponding to the plurality of lower atom beam sources 17-1 and 17-2 and the plurality of upper atom beam sources 18-1 and 18-2. The gas kind switching mechanism corresponding to the lower atom beam source 17-$i$ (i=1, 2) among the plurality of gas kind switching mechanisms supplies a given gas to the lower atom beam source 17-$i$ according to a control by the control unit of the room-temperature bonding apparatus. That is to say, the gas kind switching mechanism 61 has a plurality of gas supply units 62-1 to 62-4, a plurality of valves 63-1 to 63-4, and a conduit 64, as shown in FIG. 3. The plurality of gas supply units 62-1 to 62-4 are arranged outside the bonding chamber 3. The plurality of gas supply units 62-1 to 62-4 are formed from a plurality of gas cylinders, for example, and each emit different kinds of gases. For example, the gas supply unit 62-1 emits argon gas Ar, the gas supply unit 62-2 emits neon gas Ne, the gas supply unit 62-3 emits krypton gas Kr, and the gas supply unit 62-4 emits xenon gas Xe. The plurality of valves 63-1 to 63-4 are positioned outside the bonding chamber 3. An optional valve 63-$k$ (k=1, 2, 3, 4) among the plurality of valves 63-1 to 63-4 supplies gas emitted from a corresponding one of the plurality of gas supply units 62-$k$ to the conduit 64 or stops the gas from being supplied to the conduit 64, according to a control by the control unit of the room-temperature bonding apparatus. The conduit 64 connects the plurality of valves 63-1 to 63-4 to the lower atom beam source 17-$i$ so that the gas supplied through the plurality of valves 63-1 to 63-4 to the conduit 64 is supplied to the lower atom beam source 17-$i$. At this time, the lower atom beam source 17-$i$ emits a fast atom beam generated with the use of the gas supplied from the gas kind switching mechanism 61 according to a control by the control unit of the room-temperature bonding apparatus.

The upper atom beam source 18-$i$ has another gas kind switching mechanism like the case of the lower atom beam source 17-$i$. The gas kind switching mechanism is formed in the same way as the gas kind switching mechanism 61, and supplies a given gas to the upper atom beam source 18-$i$ according to a control by the control unit of the room-temperature bonding apparatus. At this time, the upper atom beam source 18-I emits a fast atom beam generated with the use of the gas supplied from the gas kind switching mechanism according to a control by the control unit of the room-temperature bonding apparatus.

Figure 4:
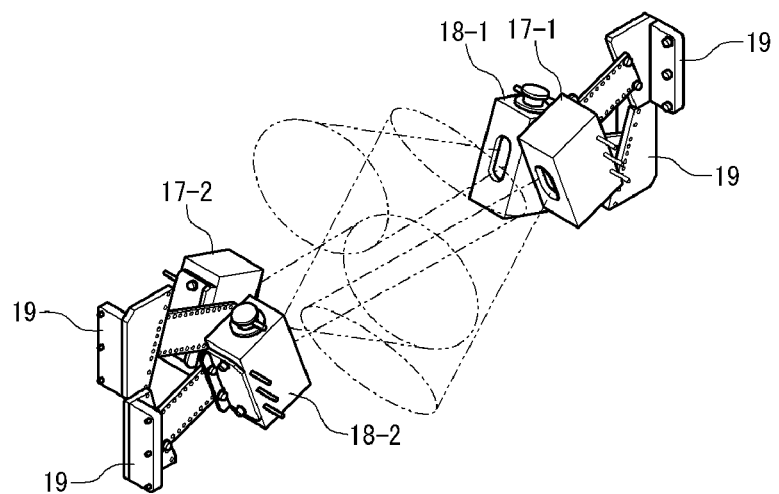
FIG. 4 is a perspective view showing an activation unit.

The bonding chamber 3 further has a plurality of installation position adjusting mechanisms 19 corresponding to the plurality of lower atom beam sources 17-1 and 17-2 and the plurality of upper atom beam sources 18-1 and 18-2, as shown in FIG. 4. The plurality of installation position adjusting mechanisms 19 are positioned inside the bonding chamber 3.

Figure 5:
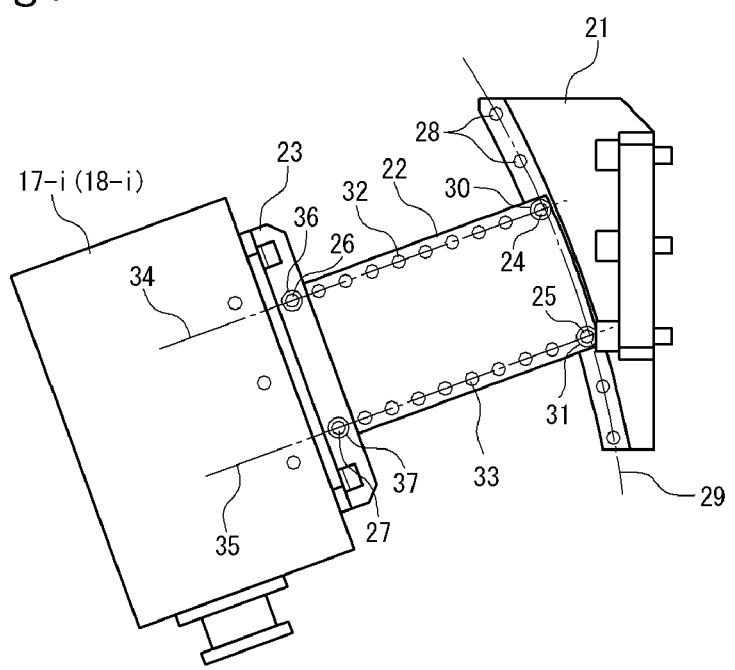
FIG. 5 is a side view showing an installation position adjusting mechanism.

The lower installation position adjusting mechanism corresponding to the lower atom beam source 17-$i$ among the plurality of installation position adjusting mechanisms 19 has an angle adjusting frame 21, a distance adjusting frame 22, a fixed frame 23, a first angle adjustment fastening member 24, a second angle adjustment fastening member 25, a first distance adjustment fastening member 26, and a second distance adjustment fastening member 27, as shown in FIG. 5. The angle adjusting frame 21 is fixed to the bonding chamber 3. The angle adjusting frame 21 has a plurality of angle adjustment holes 28. The plurality of angle adjustment holes 28 are arranged along an arc 29. The distance adjusting frame 22 has a first fixing hole 30, a second fixing hole 31, a plurality of first distance adjustment holes 32, and a plurality of second distance adjustment holes 33. The plurality of first distance adjustment holes 32 are arranged along a straight line 34. The plurality of second distance adjustment holes 33 are arranged along a straight line 35. The straight line 35 is parallel to the straight line 34. The fixed frame 23 is fixed to the lower atom beam source 17-i. The fixed frame 23 further has a third fixing hole 36 and a fourth fixing hole 37.

The first angle adjustment fastening member 24, the second angle adjustment fastening member 25, the first distance adjustment fastening member 26, and the second distance adjustment fastening member 27 are formed from jigs, each of which is composed of two parts, e.g. a bolt and a nut, the bolt being inserted into a hole and fastened.

The first angle adjustment fastening member 24 is inserted into one hole of the plurality of angle adjustment holes 28 and into the first fixing hole 30 and fastened, and the second angle adjustment fastening member 25 is inserted into another hole of the plurality of angle adjustment holes 28 and the second fixing hole 31 and fastened, thereby fixing the distance adjusting frame 22 to the angle adjusting frame 21. The first distance adjustment fastening member 26 is inserted into one hole of the plurality of first distance adjustment holes 32 and into the third fixing hole 36 and fastened, and the second distance adjustment fastening member 27 is inserted into another hole of the plurality of second distance adjustment holes 33 and into the fourth fixing hole 37 and fastened, thereby fixing the fixing frame 23 to the distance adjusting frame 22.

The upper installation position adjusting mechanism corresponding to the upper atom beam source 18-i among the plurality of installation position adjusting mechanisms 19 is formed in the same way as the lower installation position adjusting mechanism, and fixes the upper atom beam source 18-i to the bonding chamber 3.

Figure 6:
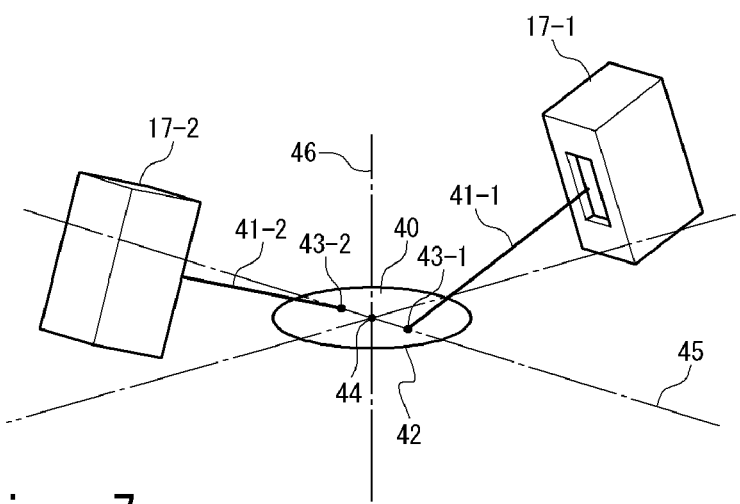
FIG. 6 is a perspective view showing a plurality of lower beam sources.

FIG. 6 shows the plurality of lower atom beam sources 17-1 and 17-2. An optional lower atom beam source 17-i among the plurality of lower atom beam sources 17-1 and 17-2, generates a fast atom beam (FAB: FAST ATOM BEAM) formed from a gas supplied from the gas kind switching mechanism 61 and emits the fast atom beam along an irradiation axis 41-i, according to a control by the control unit of the room-temperature bonding apparatus. The irradiation axis 41-i passes almost through the center of an irradiation hole of the lower atom beam source 17-i, and is generally perpendicular to the irradiation hole surface of the lower atom beam source 17-i. The fast atom beam has a property that when a flat surface perpendicular to the irradiation axis 41-i is irradiated with the fast atom beam, an etching rate for etching of a certain minute region in the surface with the fast atom beam becomes smaller as the minute region is farther from the irradiation axis 41-i. The plurality of lower atom beam sources 17-1 and 17-2 can also be controlled by the control unit of the room-temperature bonding apparatus to be independent from each other so that a first fast atom beam emitted from the lower atom beam source 17-1 is different from a second fast atom beam emitted from the lower atom beam source 17-2.

The positioning stage carriage 11 holds a lower wafer 42 inside the bonding chamber 3 such that an activation surface 40 of the lower wafer 42 is directed vertically upwardly by holding the cartridge on which the lower wafer 42 is put. The lower wafer 42 is such a single crystal wafer as silicon and sapphire for example in the form of a disk. The lower wafer 42 has a plurality of patterns on the activation surface 40. Note that the lower wafer 42 can be replaced by a substrate which is not formed in the form of a disk. The substrate is formed in the form of a rectangular plate, for example. The lower atom beam source 17-i is fixed to the bonding chamber 3 such that the irradiation axis 41-i intersects with the activation surface 40 at an intersection point 43-i when the lower wafer 42 is held by the positioning stage carriage 11.

The plurality of lower atom beam sources 17-1 and 17-2 are positioned such that intersection points 43-1 and 43-2 do not coincide with each other and such that the middle point between the intersection point 43-1 and 43-2 coincide with a center 44 of the activation surface 40. Furthermore, the plurality of lower atom beam sources 17-1 and 17-2 are positioned such that a straight line 45 which passes through the intersection point 43-1 and the intersection point 43-2 is orthogonal to an irradiation axis 41-1 and such that the straight line 45 is orthogonal to an irradiation axis 41-2. The plurality of lower atom beam sources 17-1 and 17-2 are positioned so that a distance from the irradiation hole of the lower atom beam source 17-1 to the intersection point 43-1 is equal to a distance from the irradiation hole of the lower atom beam source 17-2 to the intersection point 43-2. That is to say, the plurality of lower atom beam sources 17-1 and 17-2 are positioned to have two-fold rotational symmetry with respect to the principal rotation axis 46. The principal rotation axis 46 passes through the center 44 and is orthogonal to the activation surface 40. That is to say, the plurality of lower atom beam sources 17-1 and 17-2 are positioned such that the lower atom beam source 17-1 overlaps the lower atom beam source 17-2 when the lower atom beam source 17-1 is rotated 180 degrees (½ rotation) around the principal rotation axis 46.

At this time, the angle adjusting frame 21 of the lower installation position adjusting mechanism is positioned such that the arc 29 is along a plane orthogonal to the straight line 45 and such that the arc 29 is along a side surface of a cylinder having the straight line 45 as an axis. The distance adjusting frame 22 is formed so that the straight line 34 and the straight line 35 are parallel to the irradiation axis 41-i when the fixed frame 23 is fixed to the distance adjusting frame 22. According to the lower installation position adjusting mechanism formed in the above way, the lower atom beam source 17-i is positioned so that the irradiation axis 41-i passes through the intersection point 43-i at all times when the distance adjusting frame 22 is fixed by using an optional angle adjustment hole among the plurality of angle adjustment holes 28 and when the fixed frame 23 is fixed by using an optional distance adjustment hole among the plurality of first distance adjustment holes 32.

Because the plurality of lower atom beam sources 17-1 and 17-2 are positioned to be rotationally symmetric around to the principal rotation axis 46, the activation unit 16 can more uniformly emit a fast atom beam to the activation surface 40 and more uniformly perform etching of the activation surface 40, compared with another activation unit in which the plurality of lower atom beam sources 17-1 and 17-2 are asymmetrically positioned, when the plurality of lower atom beam sources 17-1 and 17-2 emit fast atom beams under the same condition.

Figure 7:
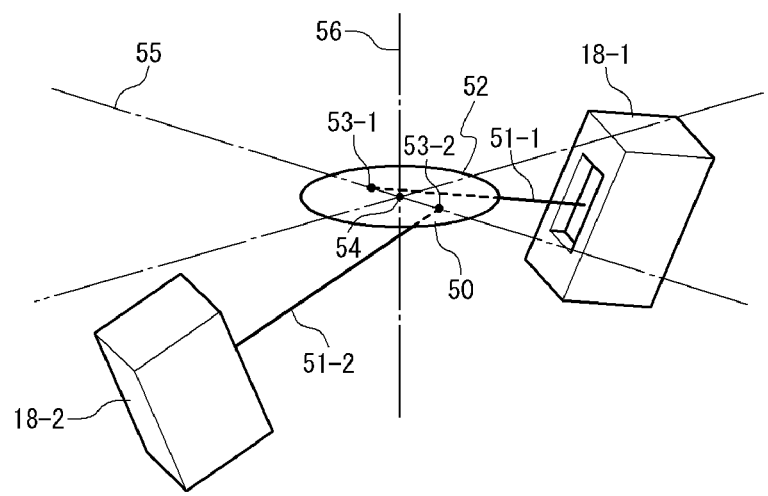
FIG. 7 is a perspective view showing a plurality of upper beam sources.

FIG. 7 shows the plurality of upper atom beam sources 18-1 and 18-2. An optional upper atom beam source 18-i among the plurality of upper atom beam sources 18-1 and 18-2, generates a fast atom beam formed from the gas supplied from the gas kind switching mechanism 61 and emits the fast atom beam along an irradiation axis 51-I, according to a control by the control unit of the room-temperature bonding apparatus. A irradiation axis 51-i passes almost through the center of an irradiation hole of the upper atom beam source 18-i, and is almost perpendicular to the irradiation hole surface of the upper atom beam source 18-i. The fast atom beam has a property that when a flat surface orthogonal to the irradiation axis 51-i is irradiated with the fast atom beam, an etching rate for etching of a certain minute region in the surface with the fast atom beam becomes smaller as the minute region is farther from the irradiation axis 51-*i*. The plurality of upper atom beam sources 18-1 and 18-2 can also be controlled by the control unit of the room-temperature bonding apparatus to be independent from each other such that a first fast atom beam emitted from the upper atom beam source 18-1 is different from a second fast atom beam emitted from the upper atom beam source 18-2.

The electrostatic chuck 14 holds an upper wafer 52 inside the bonding chamber 3 such that an activation surface 50 of the upper wafer 52 is directed vertically downwardly. The upper wafer 52 is such a single crystal wafer as silicon and sapphire, for example, in the form of a disk. The upper wafer 52 has a plurality of patterns on the activation surface 50. The substrate is formed in the form of a rectangular plate for example. The upper atom beam source 18-*i* is fixed to the bonding chamber 3 such that the irradiation axis 51-*i* intersects with the activation surface 50 at an intersection point 53-*i* when the electrostatic chuck 14 is positioned at the activation position in a case that the upper wafer 52 is held by the electrostatic chuck 14.

The plurality of upper atom beam sources 18-1 and 18-2 are positioned such that the middle point between intersection points 53-1 and 53-2 coincide with a center 54 of the activation surface 50. Furthermore, the plurality of upper atom beam sources 18-1 and 18-2 are positioned so that a straight line 55 which passes through the intersection point 53-1 and the intersection point 53-2 is orthogonal to an irradiation axis 51-1 and so that the straight line 55 is orthogonal to an irradiation axis 51-2. The plurality of upper atom beam sources 18-1 and 18-2 are positioned such that a distance from the irradiation hole of the upper atom beam source 18-1 to the intersection point 53-1 is equal to a distance from the irradiation hole of the upper atom beam source 18-2 to the intersection point 53-2. That is to say, the plurality of upper atom beam sources 18-1 and 18-2 are positioned to have two-fold rotational symmetry with respect to the principal rotation axis 56. The principal rotation axis 56 passes through the center 54 and is orthogonal to the activation surface 50, agreeing with the principal rotation axis 56. That is to say, the plurality of upper atom beam sources 18-1 and 18-2 are positioned so that the upper atom beam source 18-1 overlaps the upper atom beam source 18-2 when the upper atom beam source 18-1 is rotated 180 degrees (½ rotation) around the principal rotation axis 56.

At this time, the angle adjusting frame 21 of the upper installation position adjusting mechanism is positioned such that the arc 29 is along a plane orthogonal to a straight line 55 and such that the arc 29 is along a side surface of a cylinder having the straight line 55 as an axis. The distance adjusting frame 22 is formed so that the straight line 34 and the straight line 35 are parallel to the irradiation axis 51-*i* when the fixed frame 23 is fixed to the distance adjusting frame 22. According to the upper installation position adjusting mechanism formed in the above way, the upper atom beam source 18-*i* is positioned so that the irradiation axis 51-*i* passes through the intersection point 53-*i* at all times when the distance adjusting frame 22 is fixed by using an optional angle adjustment hole among the plurality of angle adjustment holes 28 and when the fixed frame 23 is fixed by using an optional distance adjustment hole among the plurality of first distance adjustment holes 32. by the plurality of upper atom beam sources 18-1 and 18-2 positioned to be rotationally symmetric around the principal rotation axis 56, the activation unit 16 can more uniformly emit a fast atom beam to the activation surface 50 and more uniformly perform etching of the activation surface 50, compared with another activation unit in which the plurality of upper atom beam sources 18-1 and 18-2 are asymmetrically positioned, when the plurality of upper atom beam sources 18-1 and 18-2 emit fast atom beams under the same condition.

At this time, the main body 1 of the room-temperature bonding apparatus which has the plurality of lower atom beam sources 17-1 and 17-2 and the plurality of upper atom beam sources 18-1 and 18-2, can irradiate a wider region more uniformly, compared with another room-temperature bonding apparatus having a single lower atom beam source and a single upper atom beam source. For this reason, the main body 1 of the room-temperature bonding apparatus can activate the entire surface of a larger substrate and more appropriately bond the larger substrate.

Figure 8:
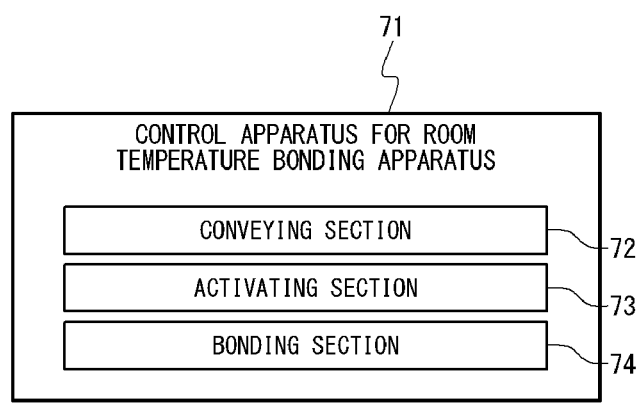
FIG. 8 is a block diagram showing a control unit of the room-temperature bonding apparatus.

FIG. 8 shows the control unit of the room-temperature bonding apparatus 71. The control unit of the room-temperature bonding apparatus 71 is a computer and has a CPU, a storage unit, and an interface, which are not shown. The CPU controls the storage unit and the interface by executing a computer program installed in the control unit of the room-temperature bonding apparatus 71. The storage unit stores the computer program and temporarily stores data created by the CPU.

The interface outputs data generated by a plurality of external devices connected to the control unit of the room-temperature bonding apparatus 71, to the CPU, and outputs data generated by the CPU to the plurality of external devices. The plurality of external devices are exemplified by an input unit, an output unit, a communication unit, and a removable memory drive. The input unit generates data through an operation by a user, and outputs the data to the CPU. The input unit is exemplified by a keyboard, a pointing device, and a touch panel. The output unit outputs data generated by the CPU so that the user can recognize the data. The output unit is exemplified by a display, a sound unit, and a touch panel. When the control unit of the room-temperature bonding apparatus 71 is connected to a communication network, the communication unit sends data generated by the CPU to other computers through the communication network, and outputs data received from other computers through the communication network, to the CPU. The communication unit is further used to download a computer program to be installed in the control unit of the room-temperature bonding apparatus 71, from other computers. When a recording medium is inserted, the removable memory drive is used to read data recorded in the recording medium. When a recording medium stores a computer program, the removable memory drive is inserted, is further used to install the computer program in the control unit of the room-temperature bonding apparatus 71. The recording medium is exemplified by a magnetic disk (a flexible disk, a hard disk), an optical disk (a CD, a DVD), a magneto-optical disk, and a flash memory.

Furthermore, the interface connects the gate valve 6, the conveyer robot 8, the vacuum exhaust unit which exhausts the load lock chamber 2, the vacuum exhaust unit 10, the alignment mechanism 12, the electrostatic chuck 14, the pressure welding mechanism 15, the plurality of lower atom beam sources 17-1 and 17-2, the plurality of upper atom beam sources 18-1 and 18-2, and the plurality of valves 63-1 to 63-4, to the control unit of the room-temperature bonding apparatus 71.

Computer programs installed in the control unit of the room-temperature bonding apparatus 71 include a plurality of computer programs for making the control unit of the room-temperature bonding apparatus 71 achieve a plurality of functions. The plurality of functions include a conveying section 72, an activating section 73, and a bonding section 74.

When the gate 5 is closed, the conveying section 72 controls the vacuum exhaust unit of the load lock chamber 2 so that a preliminary ambience at given degree of vacuum is generated inside the load lock chamber 2 or so that the atmospheric ambience is generated inside the load lock chamber 2. When the preliminary ambience is generated inside the load lock chamber 2, the conveying section 72 controls the gate valve 6 so that the gate 5 is opened and closed.

When the gate 5 is opened, the conveying section 72 controls the conveyer robot 8 so that the cartridges positioned on the plurality of shelves 7 are conveyed onto the positioning stage carriage 11 of the bonding chamber 3, or so that the cartridges held by the positioning stage carriage 11 are conveyed to the plurality of shelves 7 of the load lock chamber 2.

The conveying section 72 controls the main body 1 of the room-temperature bonding apparatus so that the upper wafer 52 is held by the electrostatic chuck 14, when the cartridge on which the upper wafer 52 is put is held by the positioning stage carriage 11 in a case that a wafer is not held by the electrostatic chuck 14. That is to say, the conveying section 72 controls the pressure welding mechanism 15 so that the electrostatic chuck 14 descends or falls down, when the cartridge on which the upper wafer 52 is put is held by the positioning stage carriage 11 in a case that a wafer is not held by the electrostatic chuck 14. The conveying section 72 controls the pressure welding mechanism 15 so that a load imposed to the electrostatic chuck 14 is measured when the electrostatic chuck 14 descends. The conveying section 72 calculates based on the load, timing at which the upper wafer 52 put on the cartridge comes into contact with the electrostatic chuck 14. The conveying section 72 controls the pressure welding mechanism 15 so that the electrostatic chuck 14 stops at the timing. The conveying section 72 controls the electrostatic chuck 14 so that the upper wafer 52 is held by the electrostatic chuck 14 when the upper wafer 52 is in contact with the electrostatic chuck 14. The conveying section 72 controls the pressure welding mechanism 15 so that the electrostatic chuck 14 ascends rises up when the upper wafer 52 is held by the electrostatic chuck 14.

The activating section 73 controls the plurality of gas kind switching mechanisms so that a given gas is supplied to the plurality of lower atom beam sources 17-1 and 17-2 and the plurality of upper atom beam sources 18-1 and 18-2. At this time, the activating section 73 can also control the plurality of gas kind switching mechanisms so that two kinds of gases supplied to two atom beam sources among the plurality of lower atom beam sources 17-1 and 17-2 and the plurality of upper atom beam sources 18-1 and 18-2 are different. When the gate 5 is closed, the activating section 73 controls the vacuum exhaust unit 10 so that an activation ambience at a given degree of vacuum is generated inside the bonding chamber 3 and so that gas is discharged at a given exhaust speed from the inside of the bonding chamber 3. The given exhaust speed is greater than the minimum exhaust speed required when only a single beam source among the plurality of lower atom beam sources 17-1 and 17-2 and the plurality of upper atom beam sources 18-1 and 18-2 emits a fast atom beam, and is smaller than maximum exhaust speed required when the plurality of lower atom beam sources 17-1 and 17-2 and the plurality of upper atom beam sources 18-1 and 18-2 simultaneously emit fast atom beams. The activating section 73 controls the pressure welding mechanism 15 so that the electrostatic chuck 14 is positioned at the activation position when the cartridge on which the lower wafer 42 is put is held by the positioning stage carriage 11 in a case that the upper wafer 52 is held by the electrostatic chuck 14.

The activating section 73 controls the activation unit 16 so that all the activation surface 40 of the lower wafer 42 and the activation surface 50 of the upper wafer 52 are activated and so that not all the activation surface 40 of the lower wafer 42 and the activation surface 50 of the upper wafer 52 are simultaneously activated, when gas is discharged at a given exhaust speed from the inside of the bonding chamber 3 by the vacuum exhaust unit 10 in a case that the electrostatic chuck 14 is positioned at the activation position. That is to say, the activating section 73 controls the plurality of lower atom beam sources 17-1 and 17-2 and the plurality of upper atom beam sources 18-1 and 18-2 so that only a single beam source among the plurality of lower atom beam sources 17-1 and 17-2 and the plurality of upper atom beam sources 18-1 and 18-2 emits a fast atom beam and so that the other beam sources other than the single beam source among the plurality of lower atom beam sources 17-1 and 17-2 and the plurality of upper atom beam sources 18-1 and 18-2 do not emit fast atom beams at optional time.

The bonding section 74 controls the pressure welding mechanism 15 so that the electrostatic chuck 14 is positioned at the alignment position when the lower wafer 42 is held by the positioning stage carriage 11 in a case that the upper wafer 52 is held by the electrostatic chuck 14. The bonding section 74 controls the alignment mechanism 12 so that the lower wafer 42 is positioned at a given alignment position with respect to the upper wafer 52 when the electrostatic chuck 14 is positioned at the alignment position. The alignment position is set so that the upper wafer 52 and the lower wafer 42 are bonded as designed when the electrostatic chuck 14 descends.

The bonding section 74 further controls the pressure welding mechanism 15 so that the electrostatic chuck 14 descends when the lower wafer 42 is positioned at the alignment position. The bonding section 74 controls the pressure welding mechanism 15 so that a load imposed to the electrostatic chuck 14 is measured when the electrostatic chuck 14 descends. The bonding section 74 calculates timing at which the load reaches a given bonding load. The bonding section 74 controls the pressure welding mechanism 15 so that the electrostatic chuck 14 stops at the timing, i.e., so that the bonding load is imposed to the upper wafer 52 and the lower wafer 42.

The bonding section 74 controls the electrostatic chuck 14 so that a bonded wafer formed from the upper wafer 52 and the lower wafer 42 is detached from the electrostatic chuck 14 after the bonding load is imposed to the upper wafer 52 and the lower wafer 42 for a given bonding time. The bonding section 74 controls the pressure welding mechanism 15 so that the electrostatic chuck 14 ascends after the bonding wafer is detached from the electrostatic chuck 14.

Figure 9:
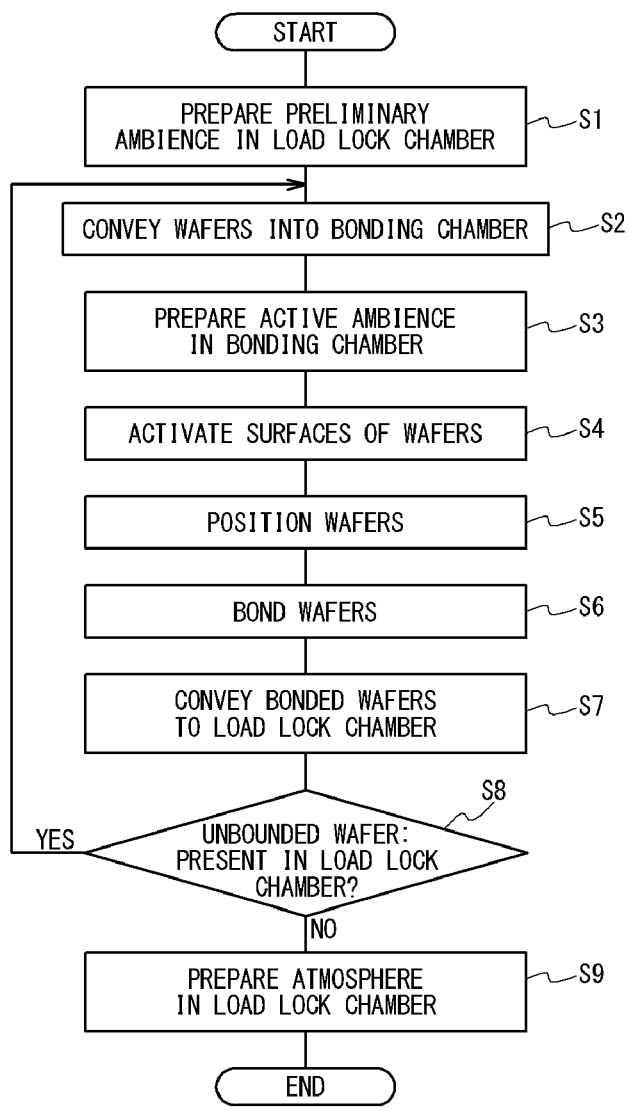
FIG. 9 is a flow chart showing a room-temperature bonding method.

FIG. 9 shows a room-temperature bonding method performed by using the room-temperature bonding apparatus according to the present invention. The control unit of the room-temperature bonding apparatus 71 firstly closes the gate 5 by controlling the gate valve 6. When the gate 5 is closed, the control unit of the room-temperature bonding apparatus 71 generates the atmospheric ambience inside the load lock chamber 2 by controlling the vacuum exhaust unit of the load lock chamber 2, and generates a bonding ambience inside the bonding chamber 3 by controlling the vacuum exhaust unit 10.

The user prepares a plurality of lower wafers, a plurality of upper wafers, a plurality of lower cartridges, and a plurality of upper cartridges. The plurality of lower wafers include the lower wafer 42. The plurality of upper wafers include the upper wafer 52. The plurality of lower cartridges correspond to the plurality of lower wafers. The plurality of upper cartridges correspond to the plurality of upper wafers. Next, when the atmospheric ambience is generated inside the load lock chamber 2, the user opens the lid of the load lock chamber 2, and positions the plurality of lower cartridges and the plurality of upper cartridges on the plurality of shelves 7. The lower wafer 42 is put on the lower cartridge corresponding to the lower wafer 42 among the plurality of lower cartridges, so that the back of the activation surface 40 faces the lower cartridge. The upper wafer 52 is put on the upper cartridge corresponding to the upper wafer 52 among the plurality of upper cartridges, so that the activation surface 50 faces the upper cartridge.

The user closes the lid of the load lock chamber 2 after the plurality of lower cartridges and the plurality of upper cartridges are positioned on the plurality of shelves 7. When the lid of the load lock chamber 2 is closed, the control unit of the room-temperature bonding apparatus 71 generates a preliminary ambience inside the load lock chamber 2 by controlling the vacuum exhaust unit of the load lock chamber 2 (step S1).

When the preliminary ambience is generated inside the load lock chamber 2, the control unit of the room-temperature bonding apparatus 71 opens the gate 5 by controlling the gate valve 6. When the gate 5 is opened, the control unit of the room-temperature bonding apparatus 71 conveys the upper cartridge from the plurality of shelves 7 to the positioning stage carriage 11 so that the upper wafer 52 is held by the positioning stage carriage 11 of the bonding chamber 3, by controlling the conveyer robot 8. When the upper wafer 52 is held by the positioning stage carriage 11, the control unit of the room-temperature bonding apparatus 71 makes the electrostatic chuck 14 descend by controlling the pressure welding mechanism 15. When the electrostatic chuck 14 descends, the control unit of the room-temperature bonding apparatus 71 measures a load imposed to the electrostatic chuck 14 by controlling the pressure welding mechanism 15. The control unit of the room-temperature bonding apparatus 71 calculates timing at which the load reaches a given contact load, based on change in the load, i.e., calculates the timing at which the upper wafer 52 put on the upper cartridge comes into contact with the electrostatic chuck 14, based on change in the load. The control unit of the room-temperature bonding apparatus 71 stops descent of the electrostatic chuck 14 at the timing by controlling the pressure welding mechanism 15.

When the electrostatic chuck 14 is in contact with the upper wafer 52, the control unit of the room-temperature bonding apparatus 71 makes the electrostatic chuck 14 hold the upper wafer 52 by controlling the electrostatic chuck 14. When the upper wafer 52 is held by the electrostatic chuck 14, The control unit of the room-temperature bonding apparatus 71 makes the electrostatic chuck 14 ascend until the electrostatic chuck 14 is positioned at the home position, by controlling the pressure welding mechanism 15. After the electrostatic chuck 14 is positioned at the home position, the control unit of the room-temperature bonding apparatus 71 conveys the upper cartridge from the positioning stage carriage 11 to the plurality of shelves 7 by controlling the conveyer robot 8. After electrostatic chuck 14 is positioned at the home position, the control unit of the room-temperature bonding apparatus 71 conveys the upper cartridge from the positioning stage carriage 11 to the plurality of shelves 7 by controlling the conveyer robot 8.

After the upper cartridge is transferred to the plurality of shelves 7, the control unit of the room-temperature bonding apparatus 71 conveys the lower cartridge from the plurality of shelves 7 to the positioning stage carriage 11 so that the lower wafer 42 is held by the positioning stage carriage 11 of the bonding chamber 3, by controlling the conveyer robot 8. After the lower cartridge is held by the positioning stage carriage 11, the control unit of the room-temperature bonding apparatus 71 closes the gate 5 by controlling the gate valve 6 (step S2).

When the gate 5 is closed, the control unit of the room-temperature bonding apparatus 71 makes the electrostatic chuck 14 ascend until the electrostatic chuck 14 is positioned at the activation position, by controlling the pressure welding mechanism 15, and generates the activation atmosphere inside the bonding chamber 3 by controlling the vacuum exhaust unit 10 (step S3). When the activation atmosphere is generated inside the bonding chamber 3, the control unit of the room-temperature bonding apparatus 71 activates the entire activation surface 40 of the lower wafer 42 and the entire activation surface 50 of the upper wafer 52, by controlling the activation unit (step S4).

When the activation surface 40 of the lower wafer 42 and the activation surface 50 of the upper wafer 52 are activated, the control unit of the room-temperature bonding apparatus 71 makes the electrostatic chuck 14 descend and positions the electrostatic chuck 14 at the alignment position, by controlling the pressure welding mechanism 15. When the upper wafer 52 and the lower wafer 42 are detached from each other by the alignment distance, the control unit of the room-temperature bonding apparatus 71 positions the lower wafer 42 at a given alignment position with respect to the upper wafer 52, by controlling the alignment mechanism 12 (step S5).

After the lower wafer 42 is positioned at the alignment position, the control unit of the room-temperature bonding apparatus 71 makes the electrostatic chuck 14 descend by controlling the pressure welding mechanism 15. When the electrostatic chuck 14 descends, the control unit of the room-temperature bonding apparatus 71 measures a load imposed to the electrostatic chuck 14 by controlling the pressure welding mechanism 15. The control unit of the room-temperature bonding apparatus 71 calculates timing at which the load reaches a given bonding load. The control unit of the room-temperature bonding apparatus 71 stops descent of the electrostatic chuck 14 at the timing, i.e., imposes the bonding load to the upper wafer 52 and the lower wafer 42, by controlling the pressure welding mechanism 15 (step S6). The lower wafer 42 and the upper wafer 52 are bonded as a result of the imposing of the bonding load and formed into a single bonded wafer.

After the bonding load is imposed to the bonding wafer for a given bonding time, the control unit of the room-temperature bonding apparatus 71 detaches the bonded wafer from the electrostatic chuck 14 by controlling the electrostatic chuck 14. After the bonded wafer is detached from the electrostatic chuck 14, the control unit of the room-temperature bonding apparatus 71 makes the electrostatic chuck 14 ascend by controlling the pressure welding mechanism 15. After the electrostatic chuck 14 sufficiently ascends, the control unit of the room-temperature bonding apparatus 71 opens the gate 5 by controlling the gate valve 6. When the gate 5 is opened, the control unit of the room-temperature bonding apparatus 71 conveys the lower cartridge from the positioning stage carriage 11 to the plurality of shelves 7 so that the bonding wafer is transferred to the load lock chamber 2 by controlling the conveyer robot 8 (step S7).

When another lower cartridge on which a lower wafer is put, among the plurality of lower cartridges, and another upper cartridge on which an upper wafer is put, among the plurality of upper cartridges are positioned on the plurality of shelves 7 (step S8, YES), the control unit of the room-temperature bonding apparatus 71 performs the operations from the step S2 to the step S7 again.

When a lower wafer and an upper wafer to be bonded are not positioned on the plurality of shelves (step S8, NO), the control unit of the room-temperature bonding apparatus 71 closes the gate 5 by controlling the gate valve 6. After the gate 5 is closed, the control unit of the room-temperature bonding apparatus 71 generates the ambience inside the load lock chamber 2 by controlling the vacuum exhaust unit of the load lock chamber 2 (step S9). After the atmosphere is generated inside the load lock chamber 2, the user takes a plurality of bonding wafers including the bonding wafer from the load lock chamber 2 by opening the lid of the load lock chamber 2 and taking the plurality of lower cartridges and the plurality of upper cartridges from the plurality of shelves 7.

When the room-temperature bonding of a plurality of other lower wafers and a plurality of other upper wafers should further be performed, a plurality of lower cartridges corresponding to the plurality of lower wafers and a plurality of upper cartridge corresponding to the plurality of upper wafers are prepared and the above room-temperature bonding method is performed again.

Figure 10:
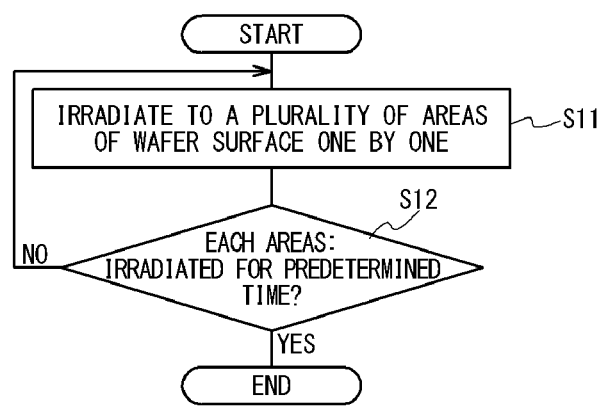
FIG. 10 is a flow chart showing an activation sequence.

FIG. 10 shows the processing of the step S4, showing an activation sequence for activating the activation surface 40 of the lower wafer 42 and the activation surface 50 of the upper wafer 52. The control unit of the room-temperature bonding apparatus 71 discharges gas from the inside of the bonding chamber 3 at a given exhaust speed by controlling the vacuum exhaust unit 10. The given exhaust speed is greater than minimum exhaust speed required when only a single beam source among the plurality of lower atom beam source 17-1 and 17-2 and the plurality of upper atom beam source 18-1 and 18-2 emits a fast atom beam, and is smaller than maximum exhaust speed required when the plurality of lower atom beam sources 17-1 and 17-2 and the plurality of upper atom beam sources 18-1 and 18-2 simultaneously emit fast atom beams.

When the activation atmosphere is generated inside the bonding chamber 3, the control unit of the room-temperature bonding apparatus 71 supplies a given gas (e.g. argon gas) to the plurality of lower atom beam sources 17-1 and 17-2 and the plurality of upper atom beam sources 18-1 and 18-2 by controlling the plurality of gas kind switching mechanisms. The control unit of the room-temperature bonding apparatus 71 makes the plurality of lower atom beam sources 17-1 and 17-2 and the plurality of upper atom beam sources 18-1 and 18-2 emit a fast atom beam one by one, by controlling the activation unit 16 during the time that the gas is discharged from the inside of the bonding chamber 3 at the given exhaust speed in a case that the electrostatic chuck 14 is positioned at the activation position. That is to say, the plurality of lower atom beam sources 17-1 and 17-2 and the plurality of upper atom beam sources 18-1 and 18-2 are numbered. First, the control unit of the room-temperature bonding apparatus 71 makes the beam source emit a fast atom beam for a given time by controlling a beam source corresponding to No. 1. After emission of a fast atom beam by a beam source corresponding to No. j (j is a natural number) stops, the control unit of the room-temperature bonding apparatus 71 controls a beam source corresponding to No. (j+1) to make the beam source emit a fast atom beam for a given time (step S11).

After emission of a fast atom beam by a beam source corresponding to the last number stops, the control unit of the room-temperature bonding apparatus 71 judges whether the activation surface 40 of the lower wafer 42 and the activation surface 50 of the upper wafer 52 are irradiated with the fast atom beam for a given etching accumulation time (step S12). For example, when the step S11 is performed t times (t is a natural number), the control unit of the room-temperature bonding apparatus 71 determines whether a time which is t times of the given time is greater than the etching accumulation time.

When a time for which the activation surface 40 of the lower wafer 42 and the activation surface 50 of the upper surface 52 are irradiated with the fast atom beams is smaller than the etching accumulation time (step S12, NO), the control unit of the room-temperature bonding apparatus 71 performs the step S11 again and irradiates the activation surface 40 of the lower wafer 42 and the activation surface 50 of the upper surface 52 with the fast atom beams for a given etching time by controlling the activation unit 16.

As a result of emission of the fast atom beams by the plurality of lower atom beam sources 17-1 and 17-2 and the plurality of upper atom beam sources 18-1 and 18-2, gases included in the fast atom beams are supplied to the inside of the bonding chamber 3. For this reason, the vacuum exhaust unit 10 needs to discharge the gases from the inside of the bonding chamber 3 even during the time for which the fast atom beams are emitted. The exhaust speed required during the time for which the activation surface 40 of the lower wafer 42 and the activation surface 50 of the upper wafer 52 are activated, is greater as an area of regions of the activation surface 40 and the activation surface 50 simultaneously activated by the activation unit 16 is greater, i.e., as the number of beam sources is greater which simultaneously emit the fast atom beam among the plurality of lower atom beam sources 17-1 and 17-2 and the plurality of upper atom beam sources 18-1 and 18-2.

According to the above activation sequence, the vacuum exhaust unit 10 exhausts the inside of the bonding chamber 3 at an exhaust speed which is greater than the minimum exhaust speed required when a single beam source among the plurality of lower atom beam sources 17-1 and 17-2 and the plurality of upper atom beam sources 18-1 and 18-2 emits the fast atom beam, thereby appropriately activating the activation surface 40 and the activation surface 50. According to the above activation sequence, the vacuum exhaust unit 10 does not need to exhaust the inside of the bonding chamber 3 at an exhaust speed which is greater than the maximum exhaust speed required when all of the plurality of lower atom beam sources 17-1 and 17-2 and the plurality of upper atom beam sources 18-1 and 18-2 simultaneously emit the fast atom beams, during the time for which the activation sequence is performed. In the room-temperature bonding apparatus of the present invention therefore, therefore, it is possible to use a small vacuum exhaust unit which cannot perform discharge at an exhaust speed greater than the maximum exhaust speed but which can perform discharge at an exhaust speed greater than the minimum exhaust speed, as the vacuum exhaust unit 10. By using such a small vacuum exhaust unit as the vacuum exhaust unit 10, the room-temperature bonding apparatus of the present invention can be manufactured in more compact size and less expensively, compared with another room-temperature bonding apparatus in which a large vacuum exhaust unit capable of performing discharge at an exhaust speed greater than the maximum exhaust speed is used.

Note that the number of atom beam sources which simultaneously emit the fast atom beams in the step S11, can be replaced by k which is different from "1" (k is a natural number smaller than the total number of the plurality of lower atom beam sources 17-1 and 17-2 and the plurality of upper atom beam sources 18-1 and 18-2). At this time, the minimum exhaust speed indicates the exhaust speed required when k beam sources among the lower atom beam sources 17-1 to 17-4 and the upper atom beam sources 18-1 and 18-2 emit the fast atom beams. In this case, too, a small vacuum exhaust unit which cannot perform discharge at any exhaust speed greater than the maximum exhaust speed and which can perform discharge at an exhaust speed greater than the minimum exhaust speed, can be used as the vacuum exhaust unit 10, and the room-temperature bonding apparatus of the present invention can be manufactured in compact size and less expensively, by using such a small vacuum exhaust unit as the vacuum exhaust unit 10.

Figure 11:
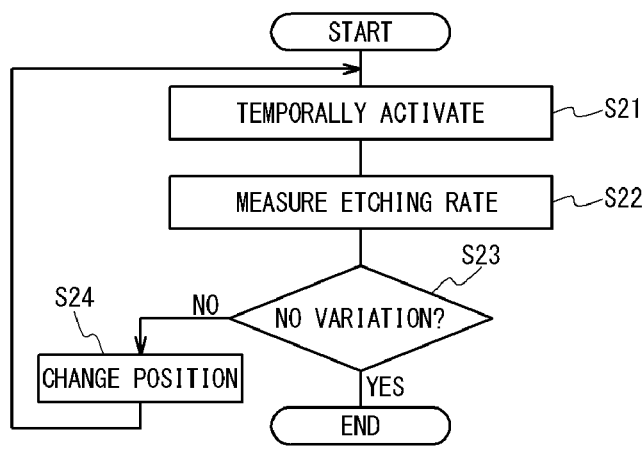
FIG. 11 is a flow chart showing a gun installation position adjusting method according to the present invention.

FIG. 11 shows a beam source installation position adjusting method according to the embodiment of the present invention. The beam source installation position adjusting method is performed by using the room-temperature bonding apparatus of the present invention. First, a user prepares a lower wafer for etching rate measurement, an upper wafer for etching rate measurement, a lower cartridge, and an upper cartridge. The lower wafer for etching rate measurement is formed from such a single crystal as silicon and sapphire, in the form of a disk. An activation surface is further formed on the lower wafer for etching rate measurement, and the activation surface is covered with adhesive tape so that only a plurality of regions distributedly positioned on the activation surface are exposed. The upper wafer for etching rate measurement is formed from such a single crystal as silicon and sapphire, in the form of a disk. An activation surface is further formed on the upper wafer for etching rate measurement, and the activation surface is covered with adhesive tape so that only a plurality of regions distributedly positioned on the activation surface are exposed.

The control unit of the room-temperature bonding apparatus 71 closes the gate 5 by controlling the gate valve 6. When the gate 5 is closed, the control unit of the room-temperature bonding apparatus 71 generates the ambience inside the load lock chamber 2 by controlling the vacuum exhaust unit of the load lock chamber 2 and generates a bonding ambience inside the bonding chamber 3 by controlling the vacuum exhaust unit 10.

When the ambience is generated inside the load lock chamber 2, the user opens the lid of the load lock chamber 2 and positions the lower cartridge and the upper cartridge on the plurality of shelves 7. The lower wafer for etching rate measurement is put on the lower cartridge so that the back of the activation surface faces the lower cartridge. The upper wafer for etching rate measurement is put on the upper cartridge so that the activation surface faces the upper cartridge. The user closes the lid of the load lock chamber 2 after the lower cartridge and the upper cartridge are positioned on the plurality of shelves 7. When the lid of the load lock chamber 2 is closed, the control unit of the room-temperature bonding apparatus 71 generates a preliminary ambience inside the load lock chamber 2 by controlling the vacuum exhaust unit of the load lock chamber 2.

When the preliminary ambience is generated inside the load lock chamber 2, the control unit of the room-temperature bonding apparatus 71 opens the gate 5 by controlling the gate valve 6. When the gate 5 is opened, the control unit of the room-temperature bonding apparatus 71 conveys the upper cartridge from the plurality of shelves 7 to the positioning stage carriage 11 so that the upper wafer for etching rate measurement is held by the positioning stage carriage 11 of the bonding chamber 3, by controlling the conveyer robot 8. When the upper wafer for etching rate measurement is held by the positioning stage carriage 11, the control unit of the room-temperature bonding apparatus 71 makes the electrostatic chuck 14 descend by controlling the pressure welding mechanism 15. When the electrostatic chuck 14 descends, the control unit of the room-temperature bonding apparatus 71 measures a load imposed to the electrostatic chuck 14 by controlling the pressure welding mechanism 15. The control unit of the room-temperature bonding apparatus 71 calculates a timing at which the load reaches a given contact load based on change in the load, i.e., calculates the timing at which the upper wafer for etching rate measurement on the upper cartridge comes into contact with the electrostatic chuck 14, based on change in the load. The control unit of the room-temperature bonding apparatus 71 stops descent of the electrostatic chuck 14 at the timing by controlling the pressure welding mechanism 15.

When the electrostatic chuck 14 is in contact with the upper wafer for etching rate measurement, the control unit of the room-temperature bonding apparatus 71 makes the electrostatic chuck 14 hold the upper wafer for etching rate measurement by controlling the electrostatic chuck 14. When the upper wafer for etching rate measurement is held by the electrostatic chuck 14, the control unit of the room-temperature bonding apparatus 71 makes the electrostatic chuck 14 ascend until the electrostatic chuck 14 is positioned at the home position by controlling the pressure welding mechanism 15. After the electrostatic chuck 14 is positioned at the home position, the control unit of the room-temperature bonding apparatus 71 conveys the upper cartridge from the positioning stage carriage 11 to the plurality of shelves 7 by controlling the conveyer robot 8.

After the upper cartridge is transferred to the plurality of shelves 7, the control unit of the room-temperature bonding apparatus 71 conveys the lower cartridge from the plurality of shelves 7 to the positioning stage carriage 11 so that the lower wafer for etching rate measurement is held by the positioning stage carriage 11 of the bonding chamber 3, by controlling the conveyer robot 8. After the lower cartridge is held by the positioning stage carriage 11, the control unit of the room-temperature bonding apparatus 71 closes the gate 5 by controlling the gate valve 6.

When the gate 5 is closed, the control unit of the room-temperature bonding apparatus 71 makes the electrostatic chuck 14 ascend until the electrostatic chuck 14 is positioned at the activation position by controlling the pressure welding mechanism 15 and generates the activation ambience inside the bonding chamber 3 by controlling the vacuum exhaust unit 10. When the activation atmosphere is generated inside the bonding chamber 3, the control unit of the room-temperature bonding apparatus 71 activates the activation surface of the upper wafer for etching rate measurement and the activation surface of the lower wafer for etching rate measurement by controlling the activation unit 16 in the same way as the step S4 (step S21).

After the activation surface of the upper wafer for etching rate measurement and the activation surface of the lower wafer for etching rate measurement are activated, the control unit of the room-temperature bonding apparatus 71 opens the gate 5 by controlling the gate valve 6. When the gate 5 is opened, the control unit of the room-temperature bonding apparatus 71 conveys the lower wafer for etching rate measurement from the positioning stage carriage 11 to the load lock chamber 2 by controlling the conveyer robot 8 and by transferring the lower cartridge from the positioning stage carriage 11 to the load lock chamber 2.

After the lower wafer for etching rate measurement is conveyed to the load lock chamber 2, the control unit of the room-temperature bonding apparatus 71 makes the upper cartridge convey from the plurality of shelves 7 to the positioning stage carriage 11 by controlling the conveyer robot 8. When the upper cartridge is held by the positioning stage carriage 11, the control unit of the room-temperature bonding apparatus 71 makes the electrostatic chuck 14 descend by controlling the pressure welding mechanism 15. When the electrostatic chuck 14 descends, the control unit of the room-temperature bonding apparatus 71 measures a load imposed to the electrostatic chuck 14 by controlling the pressure welding mechanism 15. The control unit of the room-temperature bonding apparatus 71 calculates a timing at which the load reaches a given contact load based on change in the load, i.e., calculates the timing at which the upper wafer for etching rate measurement held by the electrostatic chuck 14 comes into contact with the upper cartridge, based on change in the load. The control unit of the room-temperature bonding apparatus 71 stops descent of the electrostatic chuck 14 at the timing by controlling the pressure welding mechanism 15.

When the etching rate measurement upper wafer is in contact with the upper cartridge, the control unit of the room-temperature bonding apparatus 71 detaches the etching rate measurement upper wafer from the electrostatic chuck 14 by controlling the electrostatic chuck 14. After the etching rate measurement upper wafer is detached from the electrostatic chuck 14, the control unit of the room-temperature bonding apparatus 71 raises the electrostatic chuck 14 by controlling the pressure welding mechanism 15.

After the electrostatic chuck 14 is sufficiently raised, the control unit of the room-temperature bonding apparatus 71 conveys the etching rate measurement upper wafer from the positioning stage carriage 11 to the load lock chamber 2 by controlling the conveyer robot 8 and by conveying the upper cartridge from the positioning stage carriage 11 to the load lock chamber 2.

After the etching rate measurement lower wafer and the etching rate measurement upper wafer are positioned on the plurality of shelves 7, the control unit of the room-temperature bonding apparatus 71 closes the gate 5 by controlling the gate valve 6. After the gate 5 is closed, the control unit of the room-temperature bonding apparatus 71 generates the atmospheric ambience inside the load lock chamber 2 by controlling the vacuum exhaust unit of the load lock chamber 2. After the atmospheric ambience is generated inside the load lock chamber 2, the user takes out the etching rate measurement lower wafer and the etching rate measurement upper wafer from the load lock chamber 2 by opening the lid of the load lock chamber 2 and taking the lower cartridge and the upper cartridge from the plurality of shelves 7.

The user removes an adhesive tape from the etching rate measurement lower wafer. The user measures a plurality of etching depths corresponding to the plurality of regions which are not covered with the adhesive tape in the activation surface of the etching rate measurement lower wafer. An etching depth corresponding to a certain region among the plurality of etching depths indicates an etching depth of the region as a result of the step S21. The user further calculates a plurality of lower etching rates corresponding to the plurality of regions based on the plurality of etching depths. A lower etching rate corresponding to a certain region among the plurality of lower etching rates indicates an etching rate of the region per unit time as a result of the step S21.

The user removes the adhesive tape from the etching rate measurement upper wafer. The user measures a plurality of etching depths corresponding to a plurality of regions which are not covered with the adhesive tape in the activation surface of the etching rate measurement upper wafer. An etching depth corresponding to a certain region among the plurality of etching depths indicates an etching depth of the region as a result of the step S21. The user further calculates a plurality of upper etching rates corresponding to the plurality of regions based on the plurality of etching depths. An upper etching rate corresponding to a certain region among the plurality of upper etching rates indicates an etching rate of the region per unit time as a result of the step S21 (step S22).

The user further calculates a lower deviation based on the plurality of lower etching rates (step S23). The lower deviation indicates a standard deviation of the plurality of lower etching rates, or indicates a difference between the maximum value and the minimum value of the plurality of lower etching rates. When the lower deviation is greater than a given value (step S23, NO), the user calculates a plurality of lower optimum installation positions corresponding to the plurality of lower atom beam sources 17-1 and 17-2 based on the plurality of lower etching rates. The plurality of lower optimum installation positions are calculated so that the lower deviation is reduced when the plurality of lower atom beam sources 17-1 and 17-2 are positioned at the plurality of lower optimum installation positions, respectively. The plurality of lower optimum installation positions can also be calculated so that the plurality of lower atom beam sources 17-1 and 17-2 are not rotationally symmetric with respect to the principal rotation axis 46 when plurality of lower atom beam sources 17-1 and 17-2 are positioned at the plurality of lower optimum installation positions, respectively.

The user further calculates an upper deviation based on the plurality of upper etching rates (step S23). The upper deviation indicates a standard deviation of the plurality of upper etching rates, or indicates a difference between the maximum value and the minimum value of the plurality of upper etching rates. When the upper deviation is greater than a given value (step S23, NO), the user calculates a plurality of upper optimum installation positions corresponding to the plurality of upper atom beam sources 18-1 and 18-2 based on the plurality of upper etching rates. The plurality of upper optimum installation positions are calculated so that the upper deviation is reduced when the plurality of upper atom beam sources 18-1 and 18-2 are positioned at the plurality of optimum upper installation positions, respectively. The plurality of upper optimum installation positions can also be calculated so that the plurality of upper atom beam sources 18-1 and 18-2 are not rotationally symmetric with respect to the principal rotation axis 56 when the plurality of upper atom beam sources 18-1 and 18-2 are positioned at the plurality of upper optimum installation positions, respectively.

When the inside of the bonding chamber 3 is opened to the atmospheric ambience, the user positions the lower atom beam source 17-$i$ at a lower optimum installation position corresponding to the lower atom beam source 17-$i$ among the plurality of lower optimum installation positions, by adjusting an installation position adjusting mechanism corresponding to the lower atom beam source 17-$i$ among the plurality of installation position adjusting mechanisms 19. When the inside of the bonding chamber 3 is opened to the atmospheric ambience, the user further positions the upper atom beam source 18-$i$ at an upper optimum installation position corresponding to the upper atom beam source 18-$i$ among the plurality of upper optimum installation positions, by adjusting an installation position adjusting mechanism corresponding to the upper atom beam source 18-$i$ among the plurality of installation position adjusting mechanisms 19 (step S24). After the positions of the plurality of lower atom beam sources 17-1 and 17-2 and the plurality of upper atom beam sources 18-1 and 18-2 are adjusted, the user repeatedly performs the processing of the steps S21 to S23 until the lower deviation and the upper deviation become smaller than the given value.

A deviation of the plurality of lower etching rates can be greater than a given value even in a case that the plurality of lower atom beam sources 17-1 and 17-2 are positioned to be rotationally symmetric with respect to the principal rotation axis 46 when a manufacturing error of a plurality of parts making up the bonding chamber 3 is great. A dispersion of the plurality of upper etching rates can be greater than the given value even in a case that the plurality of upper atom beam sources 18-1 and 18-2 are positioned to be rotationally symmetric with respect to the principal rotation axis 56 when a manufacturing error of a plurality of parts making up the bonding chamber 3 is great. According to the above beam source installation position adjusting method, it is possible to reduce the deviation of the plurality of lower etching rates and to reduce the deviation of the plurality of upper etching rates even in a case that the manufacturing error is great. According to the beam source installation position adjusting method, therefore, the room-temperature bonding apparatus of the present invention can more uniformly activate the activation surface 40 of the lower wafer 42 and the activation surface 50 of the upper wafer 52 and can more appropriately perform room-temperature bonding of the lower wafer 42 and the upper wafer 52, when the room-temperature bonding method is performed.

Note that the adhesive tape can be replaced by a protective film which protects a surface of a wafer from the fast atom beam. The protective film is exemplified by a film formed of resin, and a film formed of metal. The beam source installation position adjusting method in which such a protective film is used, can be carried out in the same way as the beam source installation position adjusting method of the above-mentioned embodiment, and can more uniformly activate the activation surface 40 of the lower wafer 42 and the activation surface 50 of the lower wafer 52 and more appropriately perform room-temperature bonding of the lower wafer 42 and the upper wafer 52.

Note that the etching rate measurement lower wafer and the etching rate measurement upper wafer can be replaced by other etching rate measurement lower wafer and etching rate measurement upper wafer. The etching rate measurement lower wafer and the etching rate measurement upper wafer have silicon oxide films formed of silicon oxide on the activation surfaces. The silicon oxide film has a uniform thickness with respect to a position and is formed to have a given thickness.

At this time, in the step S22, the user measures a plurality of lower film thicknesses corresponding to the plurality of regions distributely positioned on the activation surface of the etching rate measurement lower wafer. A lower film thickness corresponding to a certain region among the plurality of lower film thicknesses indicates a thickness of the silicon oxide film of the region. The user further calculates a plurality of lower etching rates corresponding to the plurality of regions based on the plurality of lower film thicknesses.

The user further measures a plurality of upper film thicknesses corresponding to a plurality of regions distributely positioned on the activation surface of the etching rate measurement upper wafer. An upper film thickness corresponding to a certain region among the plurality of upper film thicknesses indicates a thickness of the silicon oxide film of the region. The user further calculates a plurality of upper etching rates corresponding to the plurality of regions based on the plurality of upper film thicknesses.

At this time, the plurality of optimum lower installation positions are calculated based on the plurality of lower etching rates. The plurality of upper optimum installation positions are calculated based on the plurality of upper etching rates. By performing the above beam source installation position adjusting method, the room-temperature bonding apparatus of the present invention can more uniformly activate the activation surface 40 of the lower wafer 42 and the activation surface 50 of the lower wafer 52, and can more appropriately perform room-temperature bonding of the lower wafer 42 and the upper wafer 52, as in case of performing the beam source installation position adjusting method of the above-mentioned embodiment.

Note that the number of the plurality of lower atom beam sources 17-1 and 17-2 and the plurality of upper atom beam sources 18-1 and 18-2 can be replaced by the number n which is different from 2 (n is a natural number which is different from 1). That is to say, the plurality of lower atom beam sources 17-1 and 17-2 can be replaced by the n lower atom beam sources. The n lower atom beam sources are positioned to have n-fold rotational symmetry with respect to the principal rotation axis. The principal rotation axis passes through the center of a wafer for activation, and is orthogonal to the activation surface of the wafer. That is to say, the n lower atom beam sources are positioned to overlap the n lower atom beam sources when the n lower atom beam sources are rotated (360/n) degrees (1/n rotation) around the principal rotation axis. The plurality of upper atom beam sources 18-1 and 18-2 can be replaced by n upper atom beam sources. The n upper atom beam sources are positioned to have n-fold rotational symmetry with respect to the principal rotation axis. The principal rotation axis passes through the center of a wafer for activation, and is orthogonal to the activation surface of the wafer. That is to say, the n upper atom beam sources are positioned to overlap the n upper atom beam sources when the n upper atom beam sources are rotated (360/n) degrees (1/n rotation) around the principal rotation axis.

The room-temperature bonding apparatus in which the n lower atom beam sources and the n upper atom beam sources are used, can more uniformly activate the activation surface 40 of the lower wafer 42 and the activation surface 50 of the upper wafer 52, and can more appropriately perform room-temperature bonding of the lower wafer 42 and the upper wafer 52, by performing the room-temperature bonding method, as in case of the room-temperature bonding apparatus of the above-mentioned embodiment.

Note that a lower installation position adjusting mechanism corresponding to the lower atom beam source 17-$i$ among the plurality of installation position adjusting mechanisms 19 can also be replaced by another lower installation position adjusting mechanism which can fix the lower atom beam source 17-*i* to the bonding chamber 3 so that the irradiation axis 41-*i* intersects with the activation surface 40 of the lower wafer 42 at an optional intersection point set by the user. An upper installation position adjusting mechanism corresponding to the upper atom beam source 18-*i* among the plurality of installation position adjusting mechanisms 19 can also be replaced by another upper installation position adjusting mechanism which can fix the upper atom beam source 18-*i* to the bonding chamber 3 so that the irradiation axis 51-*i* intersects with the activation surface 50 of the upper wafer 52 at an optional intersection point set by the user.

The above installation position adjusting mechanisms more improve degree of freedom of positions where the plurality of lower atom beam sources 17-1 and 17-2 and the plurality of upper atom beam sources 18-1 and 18-2 are located. For this reason, the room-temperature bonding apparatus in which the above installation position adjusting mechanisms are used, can more reduce a deviation of the plurality of lower etching rates and can more reduce a deviation of the plurality of upper etching rates by performing the beam source installation position adjusting method of the present invention, compared with the room-temperature bonding apparatus of the above-mentioned embodiments. As a result, the room-temperature bonding apparatus can more uniformly activate the activation surface 40 of the lower wafer 42 and the activation surface 50 of the upper wafer 52, and can more appropriately perform the room-temperature bonding of the lower wafer 42 and the upper wafer 52, when the room-temperature bonding method is performed.

Figure 12:
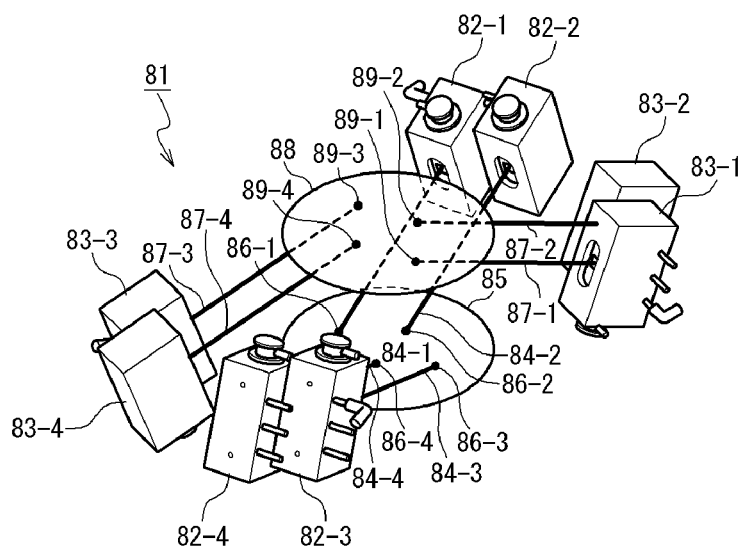
FIG. 12 is a perspective view showing another activation unit.

In a room-temperature bonding apparatus according to an embodiment of the present invention, the activation unit 16 of the above-mentioned embodiment is replaced by another activation unit. For example, an activation unit 81 has a plurality of lower atom beam sources 82-1 to 82-4 and a plurality of upper atom beam sources 83-1 to 83-4, as shown in FIG. 12. An optional lower atom beam source 82-*x* (x=1, 2, 3, 4) among the plurality of lower atom beam sources 82-1 to 82-4 emits a fast atom beam along an irradiation axis 84-*x* according to a control by the control unit of the room-temperature bonding apparatus 71, in the same way as the lower atom beam source 17-*i* of the above-mentioned embodiment. The irradiation axis 84-*x* intersects with an activation surface of a lower wafer 85 held by the positioning stage carriage 11, at an intersection point 86-*x*.

The plurality of lower atom beam sources 82-1 to 82-4 are positioned to have two-fold rotational symmetry with respect to a principal rotation axis. The principal rotation axis passes through the center of an activation surface of the lower wafer 85, and is orthogonal to the activation surface.

An optional upper atom beam source 83-*x* among the plurality of upper atom beam sources 83-1 to 83-4 emits a fast atom beam along an irradiation axis 87-*x* according to a control by the control unit of the room-temperature bonding apparatus 71 in the same way as the upper atom beam source 18-*i* of the above-mentioned embodiment. The irradiation axis 87-*x* intersects with the activation surface of the upper wafer 88 held by the electrostatic chuck 14 at the intersection point 89-*x* when the electrostatic chuck 14 is positioned at the activation position.

The plurality of upper atom beam sources 83-1 to 83-4 are positioned to have two-fold rotational symmetry with respect to a principal rotation axis. The principal rotation axis passes through the center of an activation surface of the upper wafer 88, and is orthogonal to the activation surface, coinciding with the principal rotation axis of the plurality of lower atom beam sources 82-1 to 82-4.

The room-temperature bonding apparatus further has a plurality of installation position adjusting mechanisms (not shown) corresponding to the plurality of lower atom beam sources 82-1 to 82-4 and plurality of upper atom beam sources 83-1 to 83-4. The plurality of installation position adjusting mechanisms are formed in the same way as the plurality of installation position adjusting mechanisms 19 of the above-mentioned embodiments, and fix the plurality of lower atom beam sources 82-1 to 82-4 and the plurality of upper atom beam sources 83-1 to 83-4 to the bonding chamber 3 so that it is possible to change a plurality of positions where the plurality of lower atom beam sources 82-1 to 82-4 and the plurality of upper atom beam sources 83-1 to 83-4 are placed.

The room-temperature bonding apparatus in which the activation unit 81 is used, can more uniformly irradiate a wider region with a fast atom beam, compared with another room-temperature bonding apparatus having fixed 4 or less lower atom beam sources and 4 or less upper atom beam sources. Therefore, the above room-temperature bonding apparatus can activate the entire surface of a larger substrate and can more appropriately perform bonding of the larger substrate.

The above room-temperature bonding apparatus can perform the room-temperature bonding method in the same way as the room-temperature bonding apparatus of the above-mentioned embodiment. The above room-temperature bonding apparatus in which a small vacuum exhaust unit can be used as the vacuum exhaust unit 10 in the same way as the room-temperature bonding apparatus of the above-mentioned embodiments, can be made in more compact size and less expensively, by performing the room-temperature bonding method.

The above room-temperature bonding apparatus can further perform the beam source installation position adjusting method of the present invention in the same way as the room-temperature bonding apparatus of the above-mentioned embodiments. By performing the beam source installation position adjusting method of the present invention, the above room-temperature bonding apparatus can more uniformly activate the activation surface of the lower wafer 85 and the activation surface of the upper wafer 88, and can more appropriately perform room-temperature bonding of the lower wafer 85 and the upper wafer 88 in the same way as the room-temperature bonding apparatus of the above-mentioned embodiments.

Note that the number of the plurality of lower atom beam sources 82-1 to 82-4 and the number of the plurality of upper atom beam sources 83-1 to 83-4 can be replaced by m number which is different from 4 (m is a natural number which is different from a prime number). That is to say, the plurality of lower atom beam sources 82-1 to 82-4 can be replaced by m lower atom beam sources. The m lower atom beam sources are positioned to have k-fold rotational symmetry (k is a natural number which is different from 1 among divisors of m) with respect to a principal rotation axis. The principal rotation axis passes through the center of a wafer for activation, and is orthogonal to an activation surface of the wafer. That is to say, the m lower atom beam sources are positioned to overlap the m lower atom beam sources when the m lower atom beam sources are rotated (360/k) degrees (1/k rotation) around the principal rotation axis. The plurality of upper atom beam sources 83-1 to 83-4 can be replaced by m upper atom beam sources. The m upper atom beam sources are positioned to have k-fold rotational symmetry with respect to a principal rotation axis. The principal rotation axis passes through the center of a wafer for activation, and is orthogonal to an activation surface of the wafer. That is to say, the m upper atom beam sources are positioned to overlap the m upper atom beam sources when the m upper atom beam sources are rotated (360/k) degrees (1/k rotation) around the principal rotation axis.

The room-temperature bonding apparatus in which the m lower atom beam sources and the m upper atom beam sources are used, can more uniformly irradiate a wider region with a fast atom beam, in the same way as the room-temperature bonding apparatus of the above-mentioned embodiments. Therefore, the above room-temperature bonding apparatus can activate the entire surface of a larger substrate and can more appropriately perform bonding of the larger substrate. Additionally, the fact that k is 2 is preferable in that the activation unit can be positioned effectively inside the bonding chamber 3 when the inside of the bonding chamber 3 forms a cuboid.

The above room-temperature bonding apparatus can further perform the room-temperature bonding method in the same way as the room-temperature bonding apparatus of the above-mentioned embodiment. The above room-temperature bonding apparatus in which a small vacuum exhaust unit can be used as the vacuum exhaust unit 10 in the same way as the room-temperature bonding apparatus of the above-mentioned embodiments, can be made in more compact size and less expensively, by performing the room-temperature bonding method.

The above room-temperature bonding apparatus can perform the beam source installation position adjusting method of the present invention, in the same way as the room-temperature bonding apparatus of the above-mentioned embodiments. By performing the beam source installation position adjusting method of the present invention, the above room-temperature bonding apparatus can more uniformly activate the activation surface of the lower wafer 85 and the activation surface of the upper wafer 88, and can more appropriately perform room-temperature bonding of the lower wafer 85 and the upper wafer 88, in the same way as the room-temperature bonding apparatus of the above-mentioned embodiment.

Figure 13:
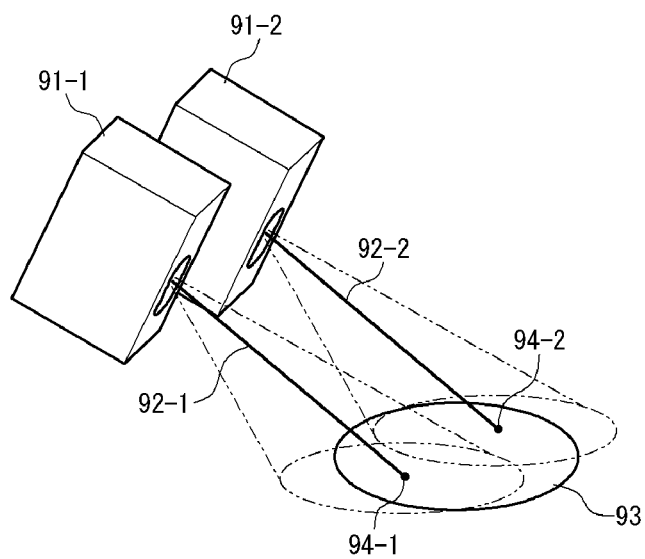
FIG. 13 is a perspective view showing still another activation unit.

In a room-temperature bonding apparatus according to another embodiment of the present invention, the activation unit 16 of the above-mentioned embodiment is replaced by another activation unit. As shown in FIG. 13, the activation unit has a plurality of lower atom beam sources 91-1 and 91-2. An optional lower atom beam source 91-$i$ among the plurality of lower atom beam sources 91-1 and 91-2 emits a fast atom beam along an irradiation axis 92-$i$ according to a control by the control unit of the room-temperature bonding apparatus 71, in the same way as the lower atom beam source 17-$i$ of the above-mentioned embodiments. The irradiation axis 92-$i$ intersects with the activation surface of the lower wafer 93 held by the positioning stage carriage 11 at the intersection point 94-$i$. The plurality of lower atom beam sources 91-1 and 91-2 are positioned so that an irradiation axis 92-2 is generally parallel to an irradiation axis 92-1.

The room-temperature bonding apparatus further has a plurality of installation position adjusting mechanisms (not shown) corresponding to the plurality of lower atom beam sources 91-1 and 91-2. The plurality of installation position adjusting mechanisms are formed in the same way as the plurality of installation position adjusting mechanisms 19 of the above-mentioned embodiments, and fix the plurality of lower atom beam sources 91-1 and 91-2 to the bonding chamber 3 so that it is possible to change a plurality of positions where the plurality of lower atom beam sources 91-1 and 91-2 are located.

The activation unit further has a plurality of upper atom beam sources which are not shown. The plurality of upper atom beam sources are positioned so that two fast atom beams are emitted toward an upper wafer and so that the two fast atom beams are emitted along the two parallel irradiation axes, in the same way as the plurality of lower atom beam sources 91-1 and 91-2.

The room-temperature bonding apparatus in which the above activation unit is used, can more uniformly irradiate a wider region of a lower wafer with a fast atom beam, compared with another room-temperature bonding apparatus having a single lower atom beam source. Therefore, the above room-temperature bonding apparatus can activate the entire surface of a larger substrate and can more appropriately perform bonding of the large substrate.

The above room-temperature bonding apparatus can further perform the room-temperature bonding apparatus in the same ways as the room-temperature bonding apparatus of the above-mentioned embodiments. The above room-temperature bonding apparatus in which a small vacuum exhaust unit can be used as the vacuum exhaust unit 10, can be made in more compact size and less expensively, in the same way as the room-temperature bonding apparatus of the above-mentioned embodiments, by performing the room-temperature bonding method.

The above room-temperature bonding apparatus can further perform the beam source installation position adjusting method of the present invention in the same way as the room-temperature bonding apparatus of the above-mentioned embodiments. By performing the beam source installation position adjusting method of the present invention, the above room-temperature bonding apparatus can more uniformly activate an activation surface of a lower wafer 93 and an activation surface of the upper wafer 88, and can more appropriately perform room-temperature bonding of the lower wafer 93 and the upper wafer 88 in the same way as the room-temperature bonding apparatus of the above-mentioned embodiment.

Note that the plurality of lower atom beam sources 91-1 and 91-2 can also be fixed to each other. In this case, too, the above room-temperature bonding apparatus can use a small vacuum exhaust unit as the vacuum exhaust unit 10 by performing the room-temperature bonding method, and can more uniformly activate the activation surface of the lower wafer by performing the beam source installation position adjusting method of the present invention, in the same way as the room-temperature bonding apparatus of the above-mentioned embodiments.

In the room-temperature bonding apparatus in which the above activation unit is used, it is possible that a distribution of etching rates on the activation surface is not symmetric with respect to the center of a wafer and that a deviation in the distribution of etching rates on the activation surface is greater than a given value. The activation units 16 and 81 of the above-mentioned embodiments can make the distribution of etching rates symmetric with respect to the center of a wafer, more uniformly activate the entire surface of a larger substrate, and more appropriately perform bonding of the large substrate, compared with the above activation unit.

Note that the plurality of lower atom beam sources 17-1 and 17-2, the plurality of upper atom beam sources 18-1 and 18-2, the plurality of lower atom beam sources 82-1 to 82-4, the plurality of upper atom beam sources 83-1 to 83-4, and the plurality of lower atom beam sources 91-1 and 91-2 can also be fixed to the bonding chamber 3. The above room-temperature bonding apparatus can more uniformly perform etching of an activation surface of a wafer, and can be made in more compact size by performing the room-temperature bonding method, as in case of the room-temperature bonding apparatus of the above-mentioned embodiments.

Note that the plurality of lower atom beam sources 17-1 and 17-2, the plurality of upper atom beam sources 18-1 and 18-2, the plurality of lower atom beam sources 82-1 to 82-4, the plurality of upper atom beam sources 83-1 to 83-4, and the plurality of lower atom beam sources 91-1 and 91-2 can be replaced by other beam sources for emitting activation beams which are different from fast atom beams. The beam sources are exemplified by an ion gun and a plasma gun. The room-temperature bonding apparatus in which the above beam source is used, can perform the room-temperature bonding method in the same way as the room-temperature bonding apparatus of the above-mentioned embodiments. By performing the room-temperature bonding method, the above room-temperature bonding apparatus can use a small vacuum exhaust unit as the vacuum exhaust unit 10, and can be made in more compact size and less expensively, in the same way as the room-temperature bonding apparatus of the above-mentioned embodiments.

The above room-temperature bonding apparatus can further perform the beam source installation position adjusting method of the present invention in the same way as the room-temperature bonding apparatus of the above-mentioned embodiments. By performing the beam source installation position adjusting method of the present invention, the above room-temperature bonding apparatus can more uniformly activate an activation surface of a lower wafer and an activation surface of the upper wafer, and can more appropriately perform room-temperature bonding of the lower wafer and the upper wafer in the same way as the room-temperature bonding apparatus of the above-mentioned embodiments.

Note that the activation sequence of the step S4 can be replaced by another activation sequence. In the activation sequence, the room-temperature boning device of the present invention activates the lower wafer and the upper wafer as a result of all the plurality of activation beams of the activation unit simultaneously emitting activation beams, during the time for which the vacuum exhaust unit 10 performs discharge.

The room-temperature bonding method in which the above activation sequence is used, can be performed when the vacuum exhaust unit 10 can perform discharge at maximum exhaust speed required when all the plurality of activation beams simultaneously emit activation beams. Even when the above room-temperature bonding method is performed, the room-temperature bonding apparatus of the present invention can more uniformly activate an activation surface of a lower wafer and an activation surface of an upper wafer, and can more appropriately perform room-temperature bonding of the lower wafer and the upper wafer, as in case of the room-temperature bonding apparatus of the above-mentioned embodiments.

In the beam source installation position adjusting method of the present invention, it is also possible to calculate the plurality of lower optimum installation positions and the plurality of upper optimum installation positions so that a deviation of the plurality of lower etching rates is not reduced, or so that a deviation of the plurality of upper etching rates is not reduced. For example, the plurality of lower optimum installation positions and the plurality of upper optimum installation positions are calculated so that a part of an activation surface of a lower wafer is etched more, compared with the other portions, or so that a part of an activation surface of an upper wafer is etched more, compared with the other portions. According to the above beam source installation position adjusting method, various room-temperature bonding can be performed.

The room-temperature bonding apparatus of the present invention can also control the plurality of lower atom beam sources and the plurality of upper atom beam sources so that two beams emitted from two atom beam sources among the plurality of lower atom beam sources and the plurality of upper atom beam sources are different, in the activation sequence of the above-mentioned embodiments. As for the plurality of lower atom beam sources and the plurality of upper atom beam sources, for example, densities of the two beams are different or velocities of the two beams are different. In the room-temperature bonding apparatus, it is also possible to control the plurality of gas kind switching mechanisms so that two kinds of gases supplied respectively to two atom beam sources among the plurality of lower atom beam sources and the plurality of upper atom beam sources are different. At this time, the room-temperature bonding apparatus can perform various room-temperature bonding including room-temperature bonding which performs bonding by activating a surface so that etching rates are different between a part and the other parts of an activation surface of a lower wafer, or so that etching rates are different between a part and the other parts of an activation surface of an upper wafer.

Note that the room-temperature bonding apparatus of the present invention can also be used without the plurality of gas kind switching mechanisms. In this case, too, the room-temperature bonding can more uniformly activate a lower wafer and an upper wafer, and can more appropriately perform room-temperature bonding of the lower wafer and the upper wafer, as in case of the above-mentioned embodiments.

The present application claims a priority based on Japanese Patent Application No. JP 2011-236545 filed on 27 Oct. 2011, the disclosure of which is all incorporated herein by reference.

The invention claimed is:

1. A room-temperature bonding apparatus comprising:
a plurality of first beam sources configured to emit a plurality of first activation beams which are irradiated to a first activation surface of a first substrate, respectively;
a plurality of second beam sources configured to emit a plurality of second activation beams which are irradiated to a second activation surface of a second substrate, respectively; and
a pressure welding mechanism configured to bond the first substrate and the second substrate by bringing the first activation surface and the second activation surface into contact after the first activation surface and the second activation surface are irradiated;
a plurality of installation adjusting mechanisms corresponding to said plurality of first beam sources and said plurality of second beam sources,
wherein one installation adjusting mechanism, corresponding to an optional beam source, of said plurality of installation adjusting mechanisms fixes the optional beam source on an optional installation position of a plurality of installation positions;
a first support apparatus configured to support the first substrate when the first activation surface is irradiated by the plurality of first activation beams; and a second support apparatus configured to support the second substrate when the second activation surface is irradiated by the plurality of second activation beams, wherein the plurality of first beam sources are arranged to be rotationally symmetric with respect to a first rotation axis, wherein the first rotation axis is orthogonal to the first activation surface when the first activation surface is irradiated by the plurality of first activation beams, wherein said plurality of second beam sources are arranged to be rotationally symmetric with respect to a second rotation axis, and wherein the second rotation axis is orthogonal to the second activation surface when the second activation surface is irradiated with the plurality of second activation beams.

2. The room-temperature bonding apparatus according to claim 1, further comprising:

a control unit configured to control said plurality of first beam sources and said plurality of second beam sources such that an optional activation beam of the plurality of first activation beams and the plurality of second activation beams is different from another activation beam, which is different from the optional activation beam, of the plurality of first activation beam and the plurality of second activation beams.

3. The room-temperature bonding apparatus according to claim 2, further comprising:

an exhaust unit configured to generate a vacuum inside a chamber in which the plurality of first activation beams and the plurality of second activation beams are emitted, by exhausting the inside of the chamber, wherein said control unit controls the plurality of first activation beam sources and the plurality of second activation beam sources such that another activation beam, which is different from the optional activation beam of the plurality of first beams and the plurality of second beams, is not emitted in a period for which the optional activation beam of the plurality of first activation beams and the plurality of second activation beams is emitted.

4. The room-temperature bonding apparatus according to claim 3, further comprising:

a plurality of gas kind switching mechanisms corresponding to said plurality of first beam sources and said plurality of second beam sources, wherein one gas kind switching mechanism corresponding to an optional beam source of said plurality of gas kind switching mechanisms supplies an optional gas of a plurality of gases to said optional beam source, and wherein said optional beam source generates an activation beam from the optional gas.

5. A beam source installation position adjusting method performed by a room-temperature bonding apparatus which comprises:

a plurality of first beam sources configured to emit a plurality of first activation beams which are irradiated to a first activation surface of a first substrate, respectively;

a plurality of second beam sources configured to emit a plurality of second activation beams which are irradiated to a second activation surface of a second substrate, respectively;

a pressure welding mechanism configured to bond the first substrate and the second substrate by bringing the first activation surface and the second activation surface into contact after the first activation surface and the second activation surface are irradiated; and a plurality of installation adjusting mechanisms corresponding to said plurality of first beam sources and said plurality of second beam sources, wherein one installation adjusting mechanism corresponding to an optional beam source of said plurality of installation adjusting mechanisms fixes the optional beam source on an optional installation position of a plurality of installation positions, said beam source installation position adjusting method comprising:

irradiating a plurality of first etching rate measurement activation beams respectively emitted from the plurality of first beam sources to a first surface of a first etching rate measurement substrate, and a plurality of second etching rate measurement activation beams respectively emitted from the plurality of second beam sources to a second surface of a second etching rate measurement substrate;

measuring a plurality of first etching rates showing etching rates of a plurality of first regions on the first surface when the plurality of first etching rate measurement activation beams are irradiated to the first surface, and a plurality of second etching rates showing etching rates of a plurality of second regions on the second surface when the plurality of second etching rate measurement activation beams are irradiated to the second surface; and adjusting the plurality of installation adjusting mechanisms such that the plurality of first beam sources are positioned to a plurality of first positions which are calculated based on the plurality of first etching rates, and the plurality of second beam sources are positioned to a plurality of second positions which are calculated based on the plurality of second etching rates.

6. The beam source installation position adjusting method according to claim 5, wherein the first surface of the first etching rate measurement substrate is covered with a protection film such that the plurality of first regions are irradiated with the plurality of first etching rate measurement activation beams, wherein one first etching rate corresponding to an optional first region of the plurality of first etching rates is calculated based on an etching depth of the optional first region when the plurality of first etching rate measurement activation beams are irradiated to the first surface, wherein the second surface of the second etching rate measurement substrate is covered with a protection film such that the plurality of second regions are irradiated with the plurality of second etching rate measurement activation beams, and wherein one second etching rate corresponding to an optional second region of the plurality of second etching rates is calculated based on an etching depth of the optional second region when the plurality of second etching rate measurement activation beams are irradiated to the second surface.

* * * * *